US007309948B2

(12) United States Patent
Kuniyasu et al.

(10) Patent No.: US 7,309,948 B2
(45) Date of Patent: Dec. 18, 2007

(54) ULTRASONIC TRANSDUCER AND METHOD OF MANUFACTURING THE SAME

(75) Inventors: Toshiaki Kuniyasu, Kaisei-machi (JP); Akinori Harada, Kaisei-machi (JP); Takashi Nakamura, Kaisei-machi (JP)

(73) Assignee: Fujifilm Corporation, Tokyo (JP)

( * ) Notice: Subject to any disclaimer, the term of this patent is extended or adjusted under 35 U.S.C. 154(b) by 207 days.

(21) Appl. No.: 11/012,837

(22) Filed: Dec. 16, 2004

(65) Prior Publication Data

US 2005/0140248 A1 Jun. 30, 2005

Related U.S. Application Data

(63) Continuation-in-part of application No. 10/309,190, filed on Dec. 4, 2002, now abandoned.

(30) Foreign Application Priority Data

Dec. 5, 2001 (JP) ............................ 2001-370841
Oct. 28, 2002 (JP) ............................ 2002-312289

(51) Int. Cl.
*H04R 17/00* (2006.01)
*H01L 41/04* (2006.01)

(52) U.S. Cl. ...................... 310/334; 367/155; 367/157; 600/347; 600/459

(58) Field of Classification Search ................ 310/334; 367/155, 157; 600/347, 459
See application file for complete search history.

(56) References Cited

U.S. PATENT DOCUMENTS 5,045,746 A * 9/1991 Wersing et al. ............ 310/334
5,164,920 A * 11/1992 Bast et al. .................. 367/140
5,493,541 A * 2/1996 Snyder ........................ 367/155
6,894,425 B1 * 5/2005 Solomon et al. ............ 310/334
2007/0063616 A1 * 3/2007 Adachi et al. .............. 310/311

FOREIGN PATENT DOCUMENTS

JP 08-186896 7/1996
JP 08289398 A * 11/1996

* cited by examiner

*Primary Examiner*—J. San Martin
(74) *Attorney, Agent, or Firm*—Sughrue Mion, PLLC

(57) ABSTRACT

An ultrasonic transducer in which electrodes can be easily and positively joined to a multiplicity of micro-fabricated vibrators and electric wiring can be easily and positively provided. The ultrasonic transducer has a vibrator arrangement having vibrators provided in a predetermined arrangement, each vibrator having first and second electrodes; an interlayer board for holding the vibrator arrangement in which through-holes are respectively formed in positions corresponding to the second electrodes of the vibrators; and a wiring board having a plurality of electrodes electrically connected to the second electrodes of the vibrators through the through-holes formed in the interlayer board, respectively.

28 Claims, 25 Drawing Sheets

100

100

ULTRASONIC TRANSDUCER AND METHOD OF MANUFACTURING THE SAME

CROSS-REFERENCE TO RELATED APPLICATION

The present application is a Continuation-In-Part of U.S. patent application Ser. No. 10/309,190 filed on Dec. 4, 2002 now abandoned. The disclosure of that application is incorporated herein by reference.

BACKGROUND OF THE INVENTION

1. Field of the Invention

The present invention relates to an ultrasonic transducer for use in ultrasonic diagnostic medicine and, more particularly, to an ultrasonic transducer including a two-dimensional sensor array. The present invention also relates to a method of manufacturing such an ultrasonic transducer.

2. Description of a Related Art

In the ultrasonic diagnostic apparatus, it has conventionally been general to use, as the ultrasonic transducer for ultrasonic-wave transmission and reception, a one-dimensional sensor array having piezoelectric elements (piezoelectric vibrators) such as piezoelectric ceramics represented by PZT (Pb (lead) zirconate titanate) or polymer piezoelectric elements represented by PVDF (polyvinyl difluoride). Furthermore, by mechanically moving such a one-dimensional sensor array, a two-dimensional image is acquired whereby a three-dimensional image is obtained by combining a plurality of two-dimensional images together.

In this approach, however, there is time lag in respect of a moving direction of the one-dimensional sensor array. Because of combining together the sectional images different in time, the resultant image will be an obscured one. Accordingly, this is not suited for an object to be inspected such as a living body as in carrying out ultrasonic-echo observations in ultrasonic diagnostic medicine.

For this reason, there is a recent attempt to use a two-dimensional sensor array having ultrasonic-wave transmitting/receiving elements arranged in two dimensions to electrically scan an object to be inspected with an ultrasonic wave wherein a technique of dynamic focusing or the like is used in a depth direction, thereby improving the quality of an ultrasonic image. Namely, by using a two-dimensional sensor array, a two-dimensional image can be acquired without mechanically moving the sensor array, which makes possible to obtain a high quality three-dimensional image.

On the other hand, in order to place a probe having a two-dimensional sensor array into practical application, there is a need to densely integrate a multiplicity of elements for transmitting and receiving ultrasonic waves. Particularly, in the case of using piezoelectric vibrators of the above-mentioned PZT or PVDF as ultrasonic-wave transmitting/receiving elements, there is a necessity of micro-fabricating the elements and wiring to a multiplicity of elements. However, there is difficulty in miniaturizing and integrating elements to an extent beyond that in the present situation. An approach to resolve them is now under consideration.

For example, JP-A-8-186896 discloses an ultrasonic transducer capable of eliminating the electric, acoustic leak between piezoelectric vibrators to improve the characteristic of an emission ultrasonic wave, and method of manufacturing the same. According to the document, the ultrasonic transducer has a plurality of piezoelectric vibrators in two-dimensional arrangement formed by completely cutting a piezoelectric plate for ultrasonic-wave emission, a plurality of drive electrodes each formed on a surface opposed to an ultrasonic-wave emitting surface of the piezoelectric vibrator, a common electrode formed on the ultrasonic-wave emitting surface of the piezoelectric vibrator, and a printed wiring board electrically connected to each of the drive electrodes to supply an externally applied voltage to the drive electrodes.

However, according to the scheme of directly joining together the piezoelectric vibrators and the solder material joined on a copper wiring arranged in the printed wiring board, the number of wiring pieces per unit area increases with increase in the number of piezoelectric vibrators, which requires to miniaturize the copper wiring in its extended portion arranged in the printed wiring board. Due to this, the adjacent ones of solder are apt to contact by the spread of solder, which causes lower in yield or reliability. Further, this scheme causes deviation in joining the solder material to the piezoelectric-vibrator electrodes, which makes it difficult to provide positive contacts. Furthermore, in this scheme, there is encountered a limitation in the number of wiring pieces. Meanwhile, in the case the printed wiring board uses a flexible wiring board such as a polyimide film, the polyimide film readily shrink due to heat, and therefore, it causes a problem that the adjacent ones of solder is put into contact by the shrinkage of the polyimide film.

In order to realize an ultrasonic transducer capable of obtaining a high-resolution ultrasonic image with reproducibility, there is a need to easily and positively carry out joining a multiplicity of precise vibrators to electrodes as well as providing electrical wiring. For this reason, there is a desire to develop a novel method of joining vibrators to electrodes, a novel method of providing wiring, and so on.

SUMMARY OF THE INVENTION

The present invention has been made in view of the foregoing problem. It is an object of the present invention to provide an ultrasonic transducer in which electrodes can be easily and positively joined to a multiplicity of micro-fabricated vibrators and electric wiring can be easily and positively provided.

In order to solve the above problem, an ultrasonic transducer according to the present invention comprises: a vibrator arrangement having a plurality of vibrators provided in a predetermined arrangement, each of the plurality of vibrators having a first electrode and a second electrode; a first board for holding the vibrator arrangement, said first board being formed with a plurality of through-holes in positions corresponding to the second electrodes of the vibrators; and a second board having a plurality of electrodes electrically connected to the second electrodes of the plurality of vibrators through the plurality of through-holes formed in the first board, respectively.

Meanwhile, a method of manufacturing an ultrasonic transducer according to the present invention comprises the steps of: (a) preparing a first board formed with a plurality of through-holes in predetermined positions; (b) arranging a plurality of vibrators, each having a first electrode and a second electrode, onto a first surface of the first board; (c) arranging a second board having a plurality of electrodes onto a second surface of the first board; and (d) arranging one of solder, resin-contained solder including a resin material with an electrode layer and a solder layer formed on the resin material, and conductive paste in the plurality of through-holes formed in the first board and electrically connecting the second electrodes of the plurality of vibrators to the plurality of electrodes of the second board through the plurality of through-holes formed in the first board respectively by using one of the solder, the resin-contained solder, and the conductive paste.

According to the invention, the electrodes formed on the vibrators and the electrodes formed on the second board are joined together by using one of the solder, the resin-contained solder, and the conductive paste arranged in the through-holes formed in the first board. It is, therefore, possible to easily and positively join the electrodes to the multiplicity of micro-fabricated vibrators and providing the electric wiring.

DESCRIPTION OF THE PREFERRED EMBODIMENTS

Figure 1:
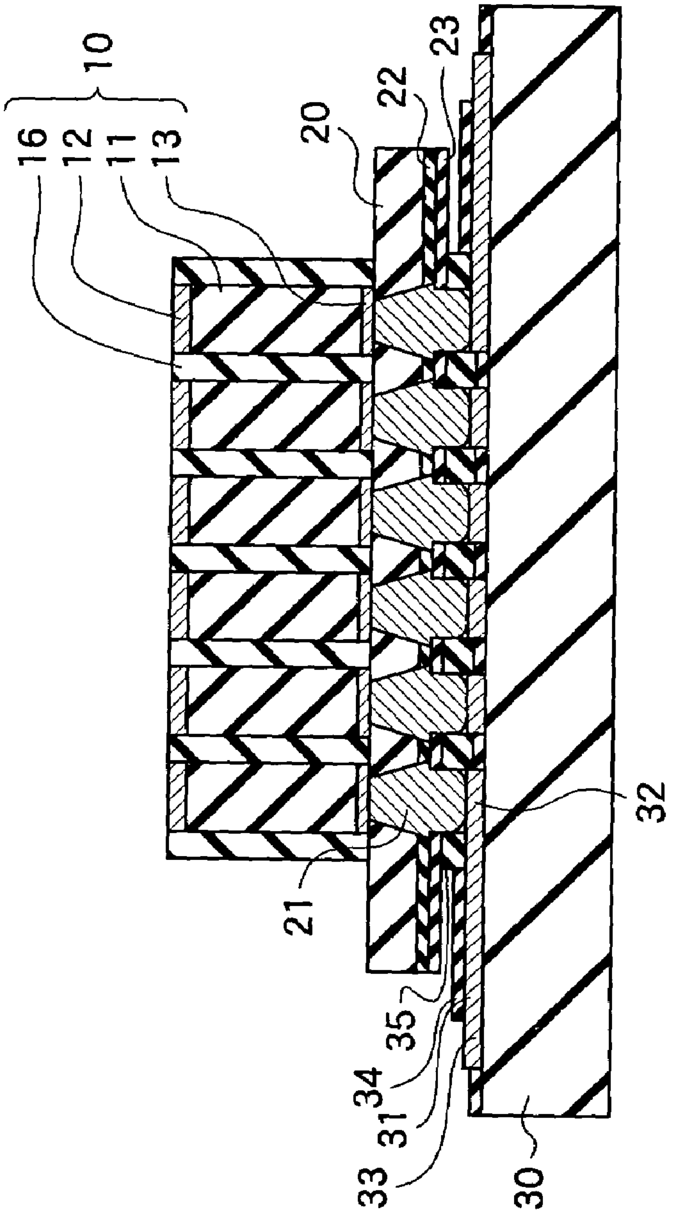
FIG. 1 is a sectional view showing an ultrasonic transducer according to a first embodiment of the present invention.

Embodiments of the present invention will now be explained with reference to the drawings. Note that the same constituent elements are attached with the same reference numerals and explanation thereof will be omitted.

Figure 2:
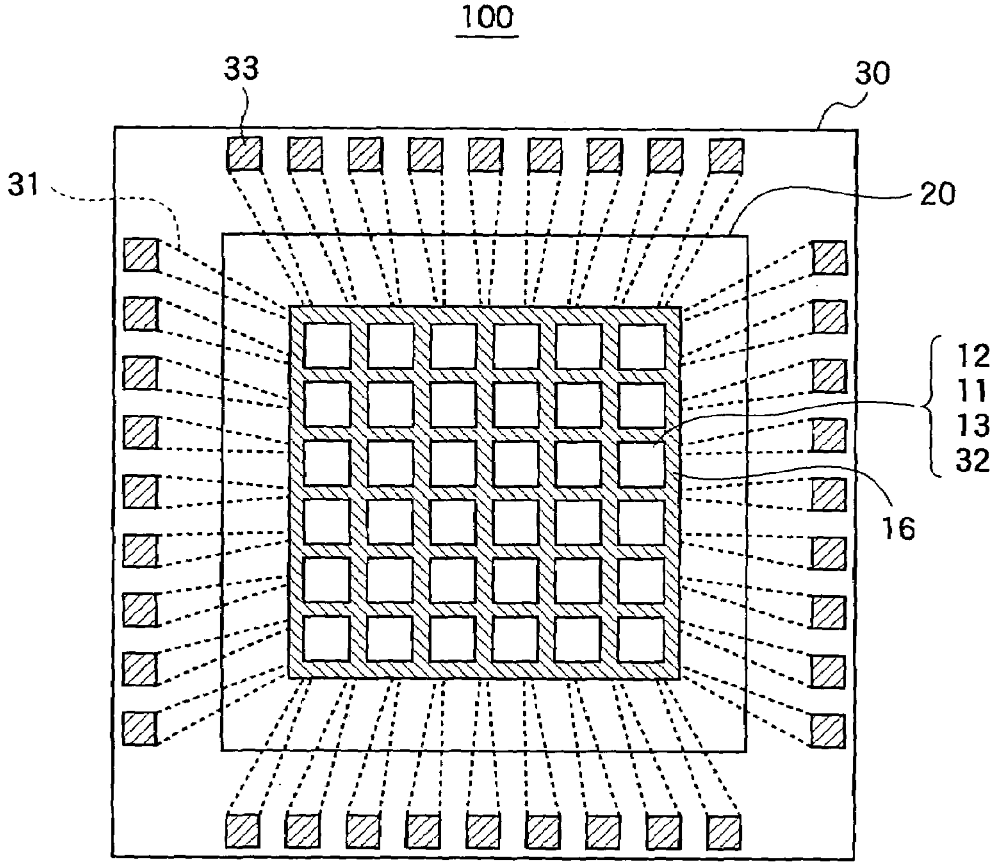
FIG. 2 is a plan view showing the ultrasonic transducer according to the first embodiment of the invention.

FIG. 1 is a sectional view showing an ultrasonic transducer according to a first embodiment of the present invention. Meanwhile, FIG. 2 is a plan view of the ultrasonic transducer as shown in FIG. 1.

As shown in FIG. 1, an ultrasonic transducer 100 includes a vibrator arrangement having a plurality of vibrators (hereinafter, merely referred also to as “elements”) arranged in two-dimensional arrangement to transmit and receive ultrasonic waves. Although the vibrator arrangement for use in actual ultrasonic diagnosis includes a multiplicity of elements in the number, for example, of 60×60 or more (several thousands to several tens of thousands), this embodiment explains with the number of elements of 6×6 for simplicity sake. In the ultrasonic transducer 100, there are used as the vibrators piezoelectric elements of piezoelectric ceramics represented by PZT (Pb (lead) zirconate titanate), polymeric piezoelectric elements represented by PVDF (polyvinyl difluoride) and so on. In this embodiment, PZT vibrators are used.

The ultrasonic transducer 100 includes a vibrator arrangement 10 having a plurality vibrators 11 arranged in a matrix form, an interlayer board 20 for holding the vibrator arrangement 10 and a wiring board 30 formed with electrodes and wiring to apply a voltage to the vibrator arrangement 10 and receive a voltage caused by the vibrator arrangement 10. The vibrator arrangement 10, the interlayer board 20 and the wiring board 30 are joined together by solder 21.

The vibrator 11 included in the vibrator arrangement 10 has electrodes 12, 13 formed at respective ends. As the electrode 12, 13, there is used, for example, a three-layer electrode formed by evaporating titanium (Ti), platinum (Pt) and gold (Au) in this order. Hereinafter, the electrode thus structured is referred to as a Ti/Pt/Au three-layer electrode.

Figure 3:
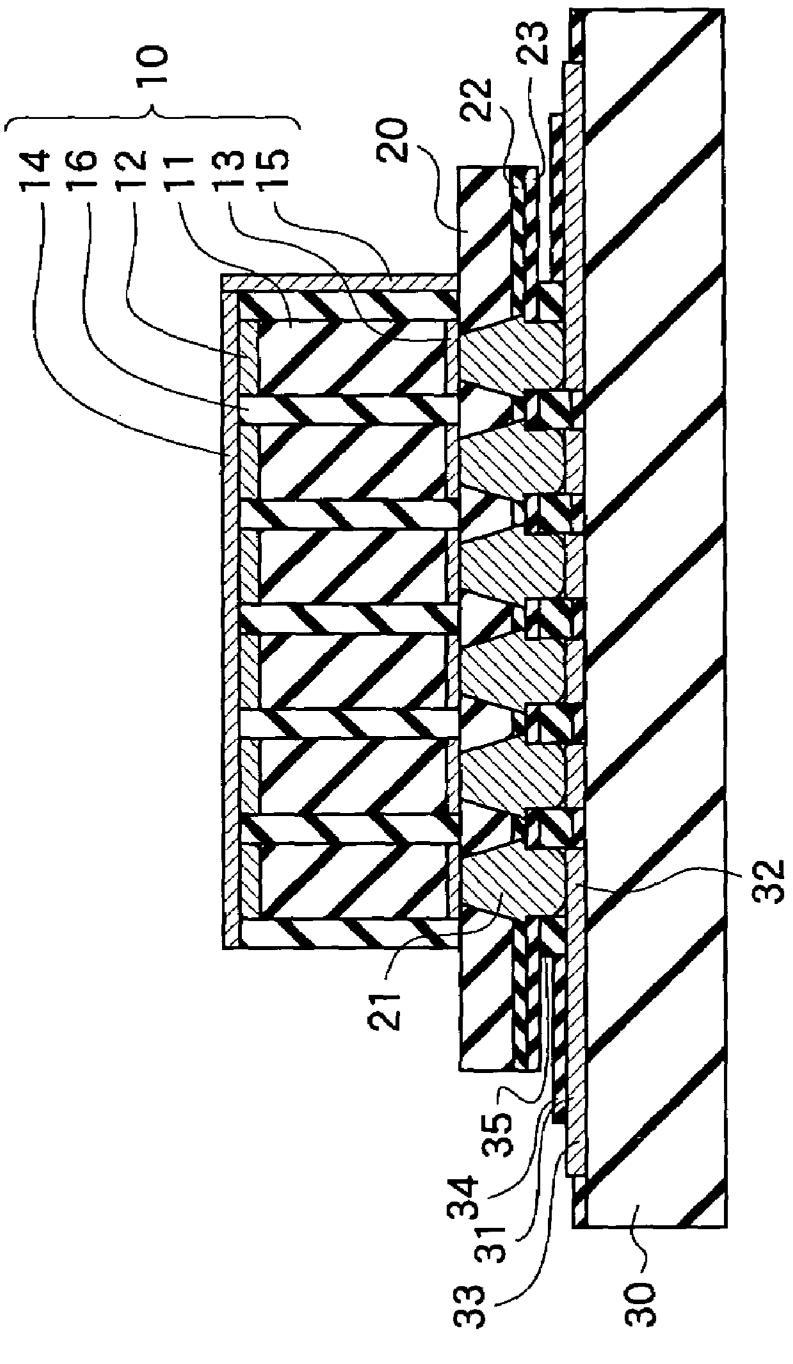
FIG. 3 is a view showing a modification to the ultrasonic transducer of FIG. 1.

Within the electrodes formed on the vibrators 11, the electrodes 12 formed on a side opposite to the interlayer board may be commonly connected between the plurality of electrodes. In this case, as shown in FIG. 3, a common electrode 14 is made by forming a silver thin film over an upper surface of the vibrator arrangement 10, and a common wiring is provided by bonding a copper plate 15 on one side surface of the vibrator arrangement 10.

Referring again to FIG. 1, the gaps between the vibrators 11 are filled with a fixing material 16, for example, of acrylic adhesive, epoxy adhesive or the like. The fixing material 16 holds the vibrators 11 and electrodes 12, 13 to absorb vibrations of the vibrators 11 thereby promptly reducing the vibrations of the vibrators 11. This can reduce the ultrasonic interference between the vibrators. Also, the vibrators 11 may be protected by forming the fixing material 16 also along the outer periphery of the matrix-arranged vibrators 11.

The interlayer board 20 is an interposed board provided in order to join the vibrator arrangement 10 and the wiring board 30 together. This is formed of, for example, silicon (Si), polyimide or the like.

The interlayer board 20 has tapered through-holes formed in a matrix form in correspondence with the arrangement of the vibrators included in the vibrator arrangement 10. The through-holes are filled with solder 21 to join together the vibrator arrangement 10, the interlayer board 20 and the wiring board 30. Namely, the solder 21 connects the electrodes 13 formed on the vibrator 11 to the matrix electrodes 32 formed on the wiring board 30, respectively. Herein, there may be used as the solder 21 a general solder or a resin-contained solder containing a resin material with a conductive-electrode layer and a solder layer formed around the resin material. Alternatively, a conductive paste such as a silver (Ag) paste may be used in place of the solder 21.

On the other surface of the interlayer board 20, an insulating layer 22 is formed. Furthermore, a lattice layer 23 is formed in a manner covering the surface in an area around the matrix-formed through-holes. The insulating layer 22 and lattice layer 23 blocks solder such that the solder filled in the through-hole does not flow out and contact the solder filled in the adjacent through-hole. As the insulating layer 22 and the lattice layer 23, such a material as insulating resin including polyimide or dielectric insulator including silicon oxide ($SiO_2$), silicon nitride (SiN) or alumina ($Al_2O_3$) can be used. These materials, possessing resistance to heat, can be used satisfactorily for a case of using solder having a melting point of nearly 150° C. to 200° C., for example. In this embodiment, an $SiO_2$ film is used as the insulating layer 22, while a polyimide insulating film is used as the lattice layer 23.

The wiring board 30 is formed of a quartz glass wafer or polyimide, for example. Considering the process of adjusting the position or pitch upon joining together the wiring board 30 and the interlayer board 20 or inspection of joining state, it is desirable to use as the wiring board 30 a material having light transmissivity. Particularly, polyimide is ready to absorb an ultrasonic wave. In case polyimide is used for the wiring board 30, there is a merit that there is less dissipation of a received ultrasonic wave.

The wiring board 30 is formed with a wiring layer 31, a matrix electrodes 32 and pad electrodes 33. The matrix electrodes 32 are formed in a matrix form in correspondence with the arrangement of the vibrators 11 arranged on the interlayer board 20. Also, the pad electrodes 33 are arranged in a peripheral region of the wiring board 30. As the wiring layer 31, the matrix electrodes 32 or the pad electrodes 33, for example, Ti/Pt/Au three-layer electrodes as mentioned before is used.

The wiring layer may be protected by forming an insulating layer 34 over the wiring layer 31. As the insulator layer 34, such a material as a resin insulator including polyimide or a dielectric insulator including $SiO_2$, SiN or $Al_2O_3$ may be used. Otherwise, these materials may be laminated to form an insulating layer 34 having layers of plural kinds of materials. In this embodiment, an $SiO_2$ film is used as the insulating layer 34.

On the wiring layer 31 or insulating layer 34, a lattice layer 35 is formed at the gaps at between the matrix electrodes 32. The lattice layer 35 blocks solder such that the solder 21 is not allowed to flow out and short between the adjacent matrix electrodes upon joining together the interlayer board 20 and the wiring board 30. In this embodiment, polyimide is used as a material of the lattice layer 35.

Referring to FIGS. 4 to 9, explanation is now made on a method of manufacturing an ultrasonic transducer according to a first embodiment of the invention.

Figure 4:
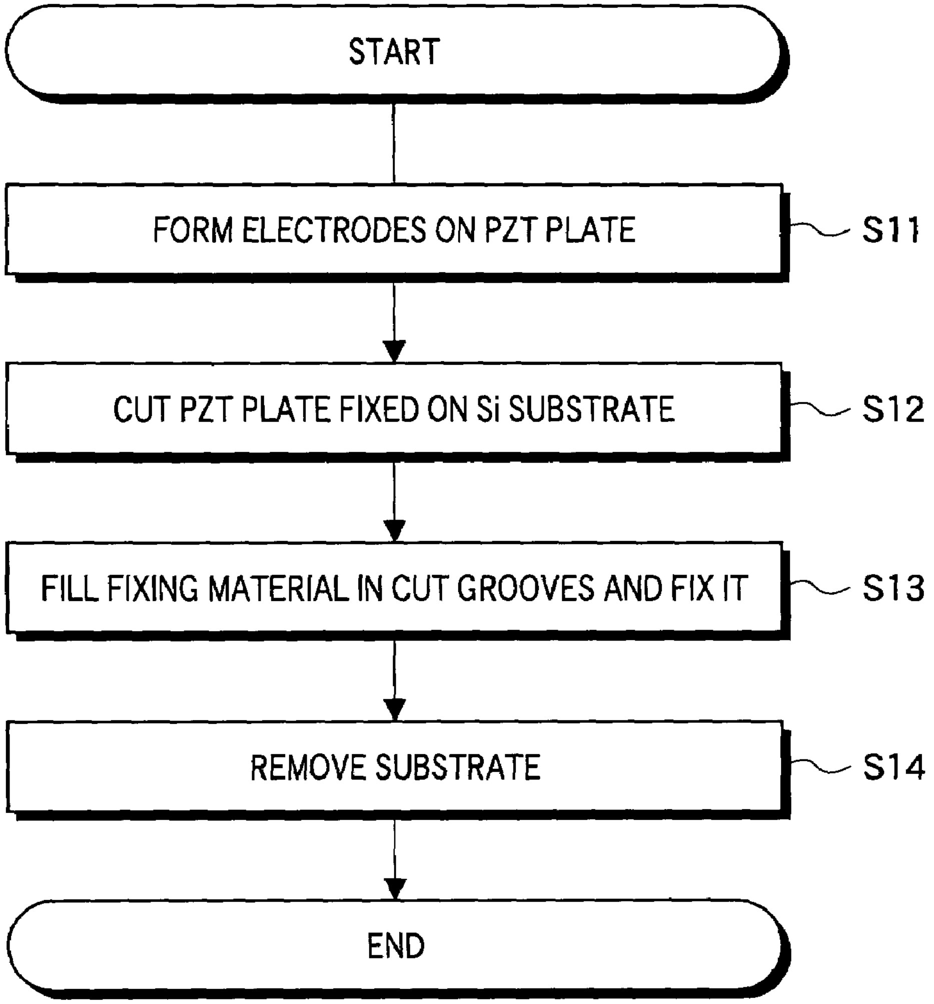
FIG. 4 is a flowchart showing a fabrication process of a vibrator arrangement in a method of manufacturing an ultrasonic transducer according to the first embodiment of the invention.

FIG. 4 is a flowchart showing a fabrication process of a vibrator arrangement in a method of manufacturing an ultrasonic transducer according to the present embodiment. Meanwhile, FIGS. 5A-5C are views for explaining the fabrication process of a vibrator arrangement.

Figure 5A:
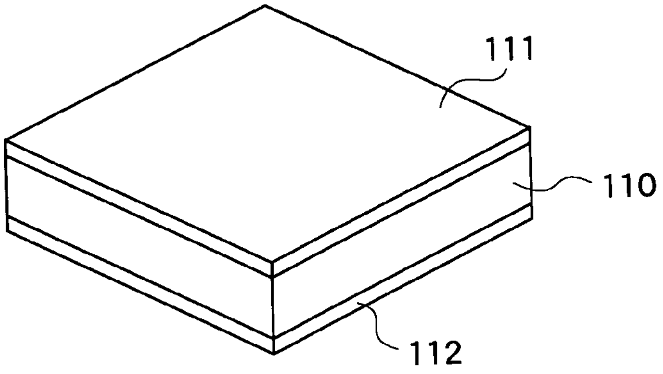
FIGS. 5A-5C are views for explaining a fabrication process of a vibrator arrangement in the method of manufacturing an ultrasonic transducer according to the first embodiment of the invention.

At step S11 of FIG. 4, electrode materials 111, 112 are formed on the respective surfaces of a PZT plate 110, as shown in FIG. 5A. In the case of forming a Ti/Pt/Au three-layer electrode, for example, a Ti layer having a thickness of 500 angstroms, a Pt layer having a thickness of 500 angstroms and an Au layer having a thickness of 5000 angstroms are vacuum-evaporated in this order.

Figure 5B:
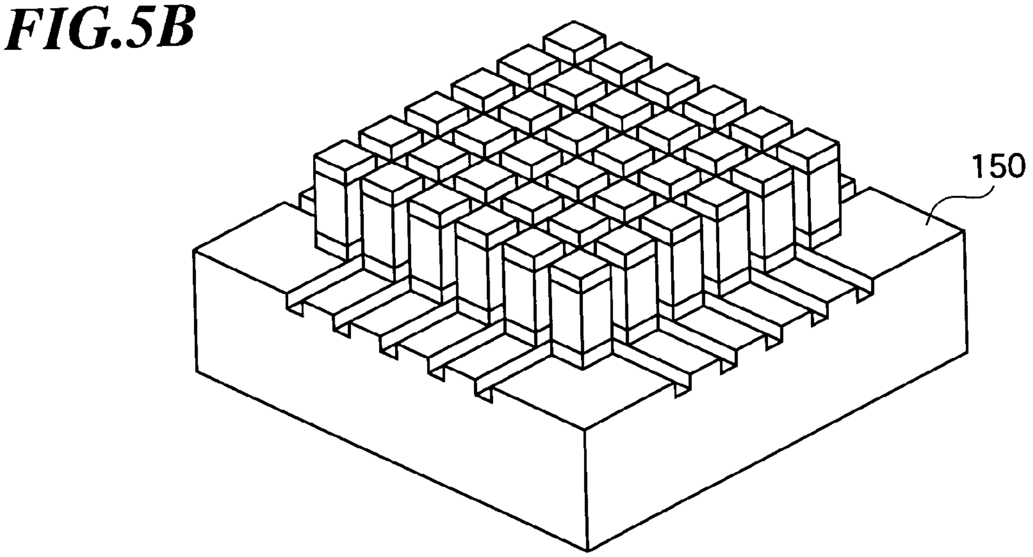

Next, at step S12, the PZT plate formed with electrode materials is fixed by wax on a substrate 150 of Si or the like, and then, the PZT plate is cut as shown in FIG. 5B. Cutting is conducted by using, for example, a 0.3 mm-pitch dicer such that the cut vibrators are in a predetermined matrix arrangement.

Figure 5C:
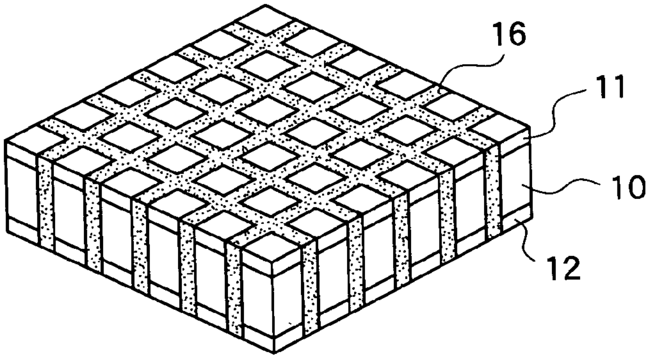

Next, at step S13, a fixing material 16 of, for example, acrylic adhesive or epoxy adhesive is filled and fixed in the cut grooves as shown in FIG. 5C.

Furthermore, at step S14, wax is fused to remove the substrate. In this manner, a vibrator arrangement having vibrators arranged in a matrix form is fabricated.

Figure 6:
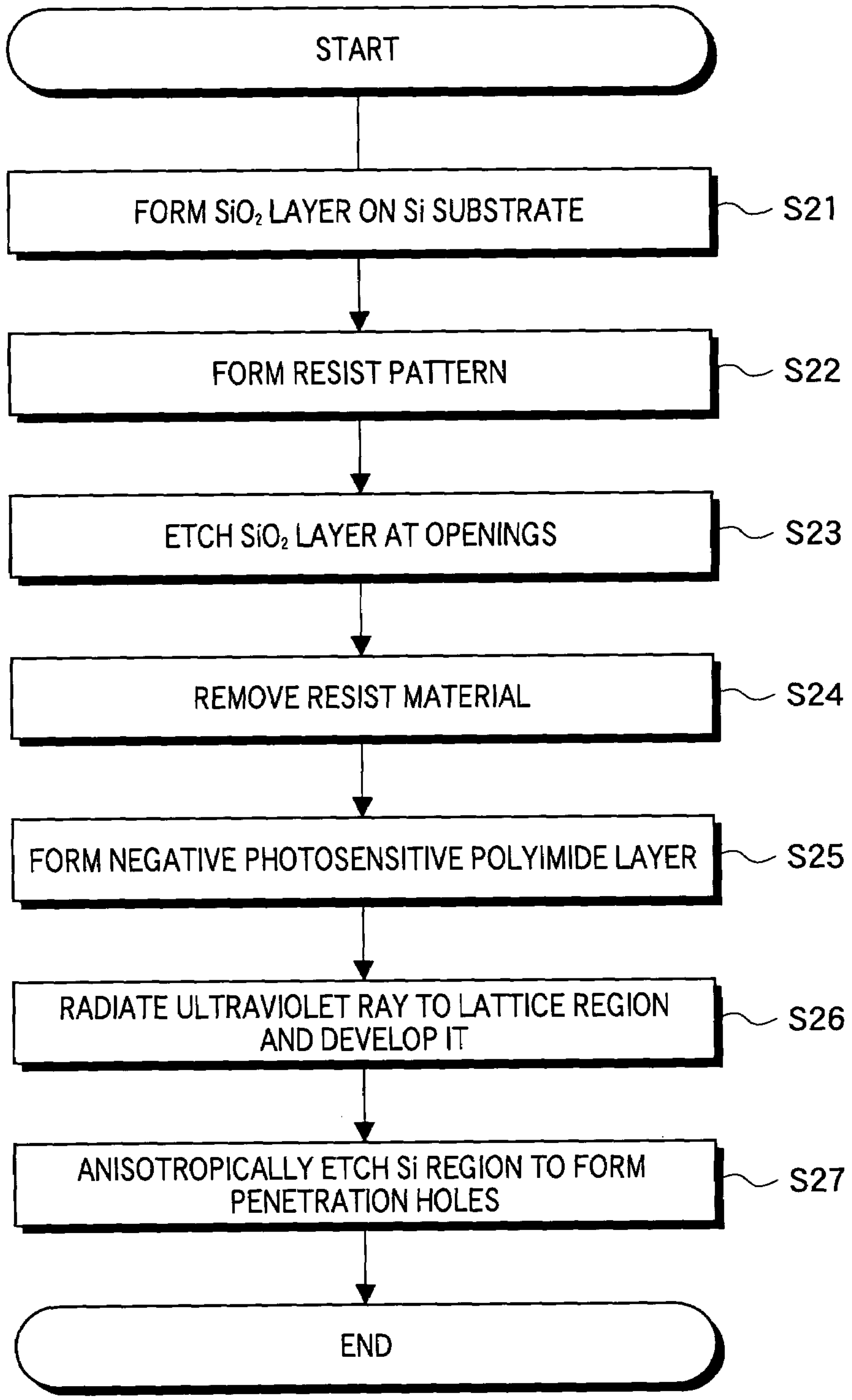
FIG. 6 is a flowchart showing a fabrication process of an interlayer board in the method of manufacturing an ultrasonic transducer according to the first embodiment of the invention.

Referring to FIGS. 6-8D, explanation is made on a fabrication process of an interlayer board. FIG. 6 is a flowchart showing a fabrication process of an interlayer board while FIGS. 7A-7C and 8A-8D are views for explaining the fabrication process of an interlayer board.

Figure 7A:
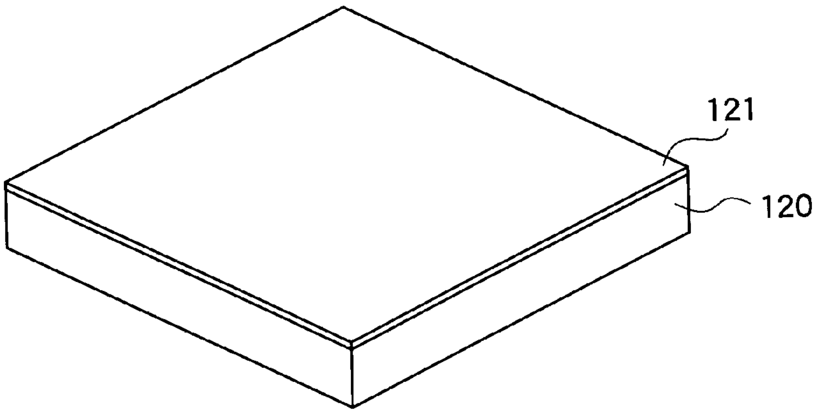
FIGS. 7A-7C are views for explaining a fabrication process of an interlayer board in the method of manufacturing an ultrasonic transducer according to the first embodiment of the invention.

First, at step S21 of FIG. 6, an $SiO_2$ layer 121 is formed on a non-doped Si substrate 120 as shown in FIG. 7A. Plasma CVD process, for example, can be used in forming the $SiO_2$ layer 121.

Figure 7B:
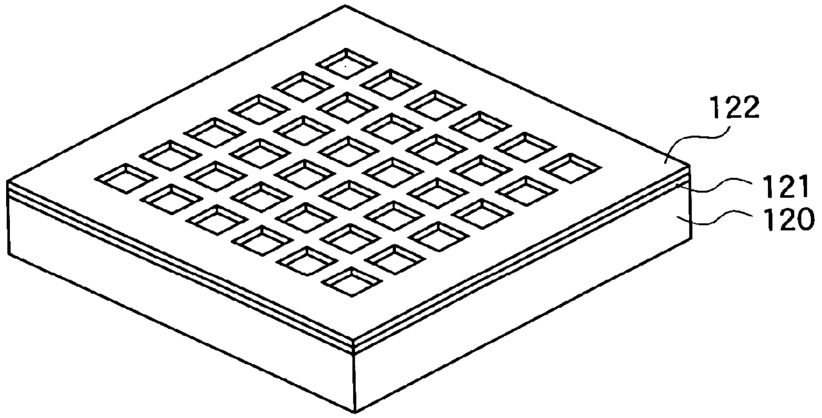
Figure 7C:
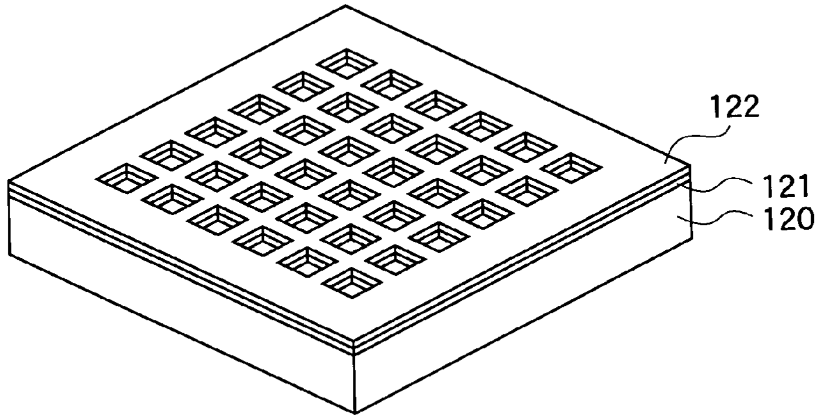

Next, at step S22, a resist pattern 122 is formed on the $SiO_2$ layer 121 to have openings in a matrix region in correspondence with an arrangement pitch of the vibrators as shown in FIG. 7B. A photolithography process is used herein, for example.

At step S23, an etching solution of a buffered hydrogen fluoride (BHF) or the like is used to etch the $SiO_2$ layer in the opened matrix region. This exposes the substrate Si surface in the opened matrix region.

Figure 8A:
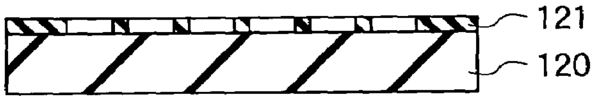
FIGS. 8A-8D are views for explaining a fabrication process of an interlayer board in the method of manufacturing an ultrasonic transducer according to the first embodiment of the invention.
Figure 8B:
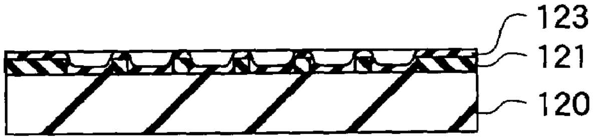

At step S24, the resist material formed at step S22 is removed away by using, for example, acetone as shown in FIG. 8A. Furthermore, at step S25, a negative photosensitive polyimide layer 123 is formed on a substrate 120 by spin coating, as shown in FIG. 8B.

Figure 8C:
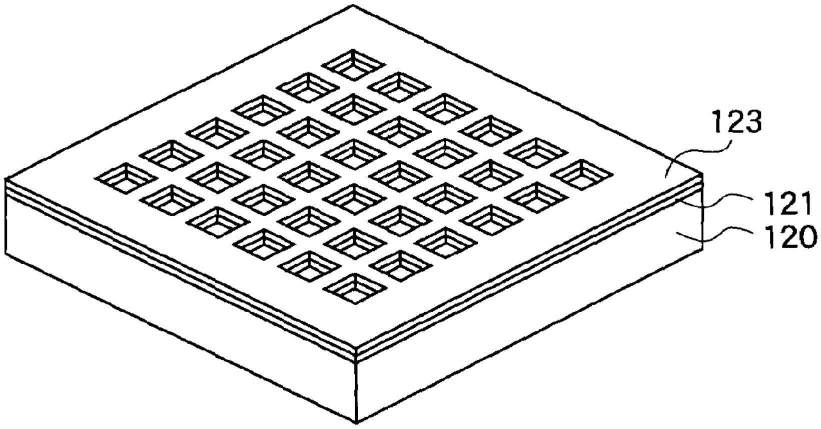

At step S26, an ultraviolet ray is radiated to a region except for the matrix region, i.e. lattice region, of the negative photosensitive polyimide layer 123. This forms a lattice layer and the substrate Si surface is exposed again as shown in FIG. 8C.

Figure 8D:
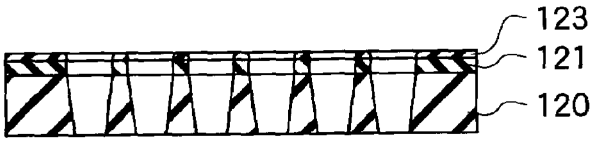

At step S27, anisotropic etching is conducted on the exposed Si surface by using, for example, a potassium hydroxide solution at 80° C. This forms through-holes in the Si substrate as shown in FIG. 8D.

Figure 9:
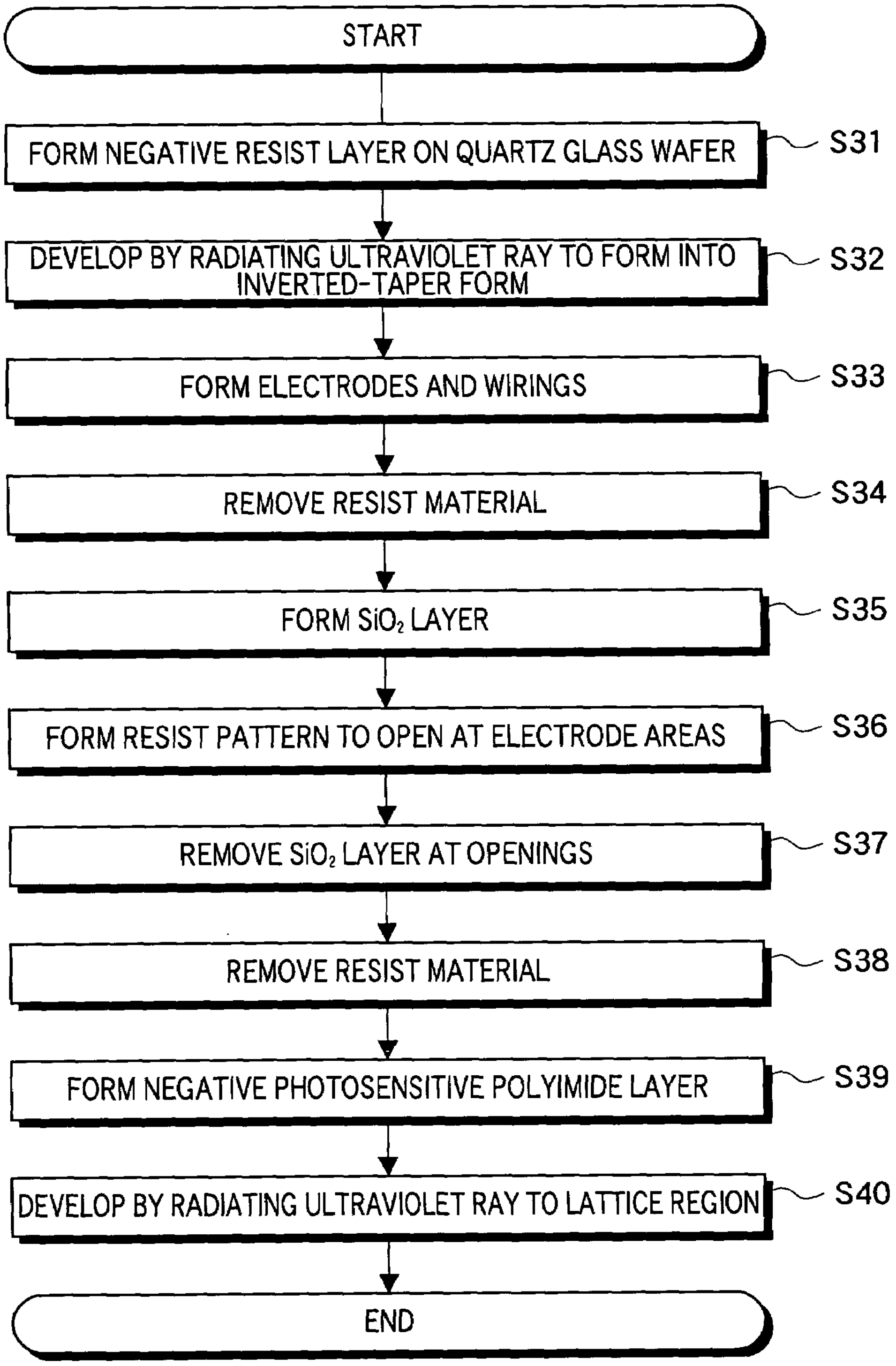
FIG. 9 is a flowchart showing a fabrication process of a wiring board in the method of manufacturing an ultrasonic transducer according to the first embodiment of the invention.
Figure 10A:
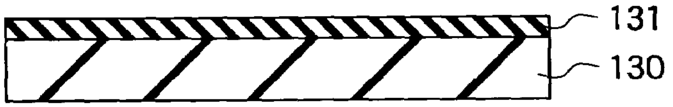
FIGS. 10A-10H are views for explaining a fabrication process of a wiring board in the method of manufacturing an ultrasonic transducer according to the first embodiment of the invention.
Figure 10B:
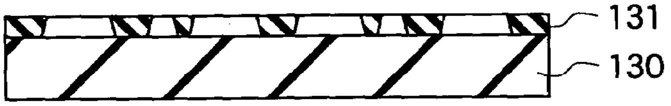
Figure 10C:
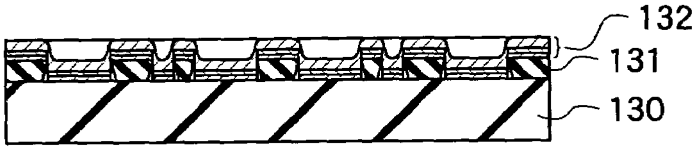
Figure 10D:
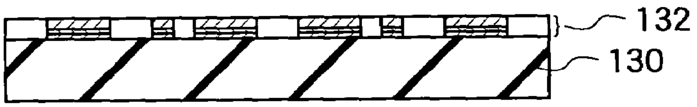
Figure 10E:
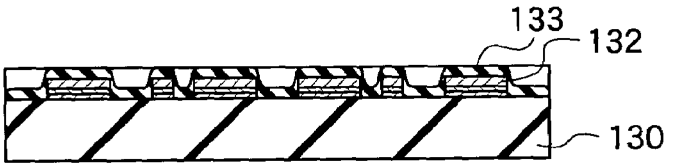
Figure 10F:
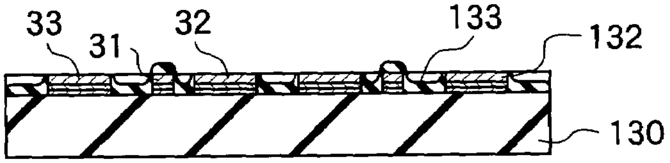
Figure 10G:
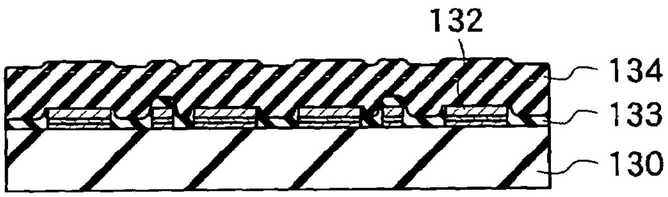
Figure 10H:
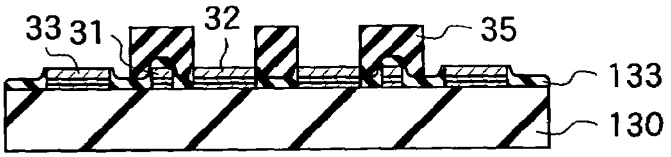

Referring to FIGS. 9-10H, explanation is now made on a fabrication process of a wiring board. FIG. 9 is a flowchart showing a fabrication process of a wiring board while FIGS. 10A-10H are views for explaining the fabrication process of a wiring board.

First, at step S31 of FIG. 9, a negative resist layer 131 is formed on a quartz glass wafer (substrate) 130 by using, for example, spin coating, as shown in FIG. 10A. Then, at step S32, an ultraviolet ray is radiated to a region except for the region to be formed into pad, matrix electrodes and wiring in the negative resist layer 131, and then development is carried out. Thereafter, the resist layer 131 is made into an inverted-taper form as shown in FIG. 10B. Herein, providing an inverted-taper form is in order to readily separate a region to be removed together with the resist layer from a region to be left as electrodes and wiring on the substrate. Because a three-layer metal layer to be subsequently formed is made of materials which are not readily removed by etching.

At step S33, an electrode-and-wiring layer 132 is formed on the substrate 130 as shown in FIG. 10C. For example, in the case of forming three-layered electrodes and wiring, Ti having a thickness of 500 angstrom, Pt having a thickness of 500 angstrom and Au having a thickness of 5000 angstroms are stacked in this order by a vacuum evaporation process.

Next, at step S34, the resist layer formed at step S31 is removed away by a lift-off technique. This removes also the metal layer formed on the resist. Thus, the electrode-and-wiring layer 132 is left on the quartz glass substrate 130 as shown in FIG. 10D.

At step S35, an $SiO_2$ layer 133 having a thickness of 2000 angstrom is formed on the substrate 130 by using a plasma CVD process, as shown in FIG. 10E. Next, at step S36, a resist pattern is formed by a photolithography process to provide openings in regions of pad electrodes 33 and matrix electrodes 32 (see FIG. 2). Furthermore, at step S37, etching is conducted by using a BHF solution or the like to remove the $SiO_2$ layer at the openings, thereby exposing the Au layer of the three-layer-electrode in the opening. Next, removing the resist material formed at step S36 by using acetone or the like provides a form as shown in FIG. 10F. In the case where the insulating layer 34 (see FIG. 1) is not provided, steps S35-S38 are omitted.

At step S39, a negative photosensitive polyimide layer 134 is formed on the substrate 130 by using, for example, spin coating, as shown in FIG. 10G. Next, at step S40, an ultraviolet ray is radiated to a lattice portion around the matrix electrode 132. This forms a lattice layer 35 as shown in FIG. 10H.

Referring to FIGS. 11A-13, explanation is now made on a process of joining together the vibrator arrangement, interlayer board and wiring board thus fabricated.

Figure 11A:
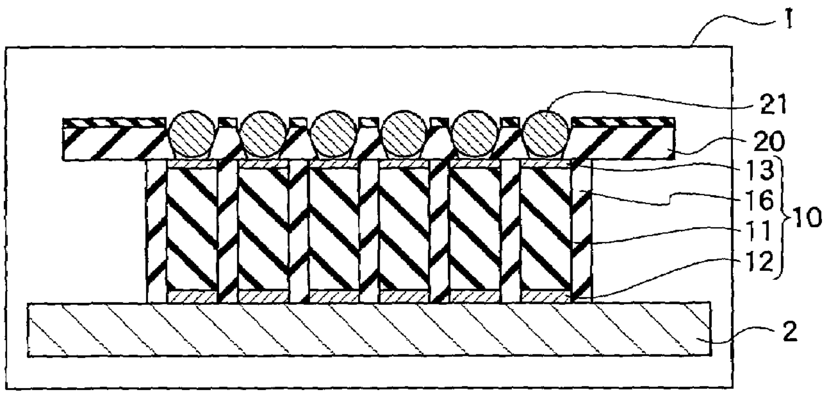
FIGS. 11A and 11B are views for explaining a process of joining together the vibrator arrangement and the interlayer board in the method of manufacturing an ultrasonic transducer according to the first embodiment of the invention.
Figure 11B:
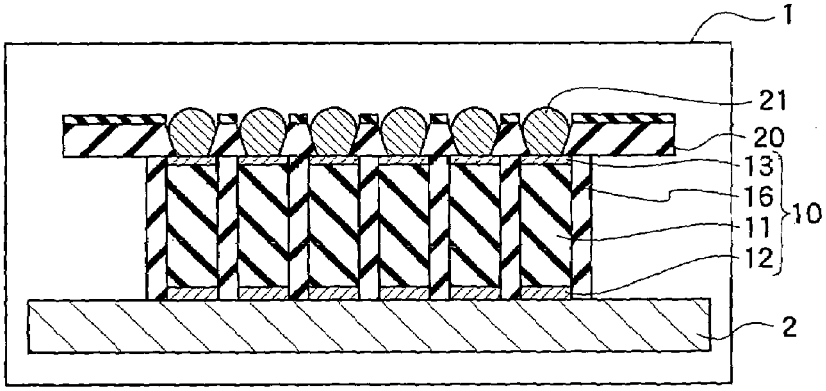

FIGS. 11A and 11B are views for explaining a process of joining the vibrator arrangement and the interlayer board together. As shown in FIG. 11A, the vibrator arrangement 10 is rested upon a heater plate 2 set up within a quartz chamber 1, on which the interlayer board 20 is stacked such that the electrodes 13 respectively formed on the vibrators 11 are opposed to the through-holes matrix-formed in the interlayer board 20. The interlayer board 20 is arranged such that the smaller diameter of the taper-formed through-hole (the lower in the figure) positions close to the vibrator arrangement 10. Furthermore, solder balls (ball-formed solder) 21 are respectively put in the through-holes of the interlayer board 20. The solder ball 21 is a low melting solder containing, for example, a material of lead-tin-silver alloy (Pb—Sn—Ag), and has a diameter greater than a thickness of the interlayer board 20 but smaller than the greater diameter of the through-hole (the upper in the figure).

Figure 12A:
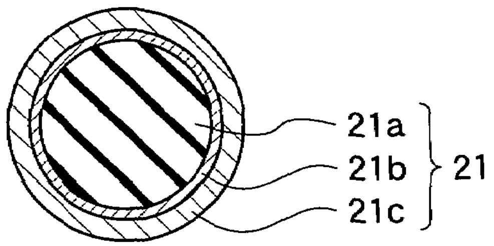
FIGS. 12A-12D are sectional views showing a resin-contained solder.
Figure 12B:
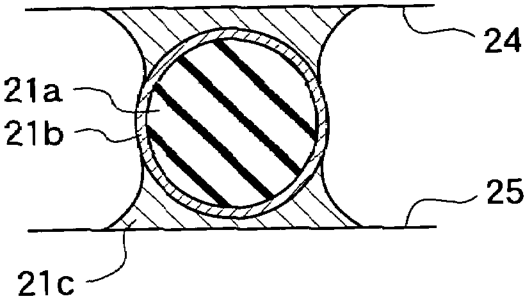
Figure 12C:
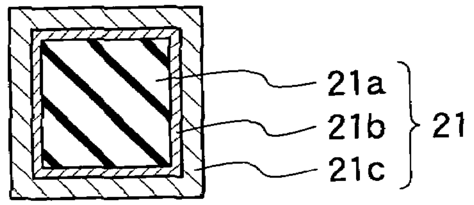
Figure 12D:
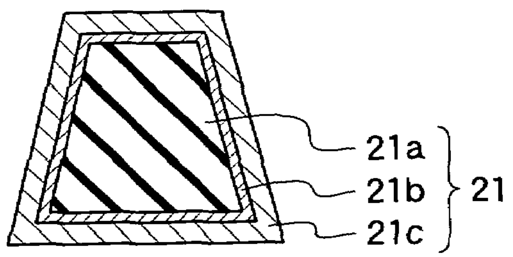

Otherwise, the solder 21 may use resin-contained solder. FIGS. 12A-12D are sectional views showing a resin-contained solder. As shown in FIG. 12A, the resin-contained solder 21 contains a resin material 21*a*, a conductive electrode layer 21*b* formed on an outer periphery of the resin material 21*a*, and a solder layer 21*c*. As the resin material 21*a*, such a material as divinylbenzene, polyimide, polystyrene, polycarbonate or the like can be used. Meanwhile, as the conductive electrode layer 21*b*, a metal or alloy containing copper or nickel can be used. Furthermore, as the solder layer 21*c*, a material of lead-tin-silver alloy (Pb—Sn—Ag) can be used. As shown in FIG. 12B, when such a resin-contained solder is arranged between the opposed electrodes 24 and 25 and then heated, the solder layer 21*c* melts to join the electrode 24 and the electrode 25 together. Herein, the resin-contained solder is not limited to a ball form in shape, but may be cubic, columnar, pyramidal or the like as shown in FIGS. 12C and 12D. Alternatively, a conductive paste may be used in place of the solder 21.

Referring again to FIG. 11A, by filling the quartz chamber 1 with an inert gas such as argon and then energizing the heater plate 2, temperature of the solder 21 is raised nearly to its melting point (e.g. 120°). Herein, the reason of heating the solder in the inert gas atmosphere is to prevent the solder from being oxidized. Due to this, as shown in FIG. 11B, a part (the lower in the figure) of the ball form of the solder 21 melts in the through-hole formed in the interlayer board 20, and the melted part is joined to a surface layer (Au layer) of the opposed electrode 13. At this time, the solder 21 is projected at its upper from the interlayer board 20 while remaining the other part of the ball form. Thereafter, the energization to the heater plate 2 is ceased so as to cool down the vibrator arrangement 10 and interlayer board 20 within the quartz chamber.

Figure 13:
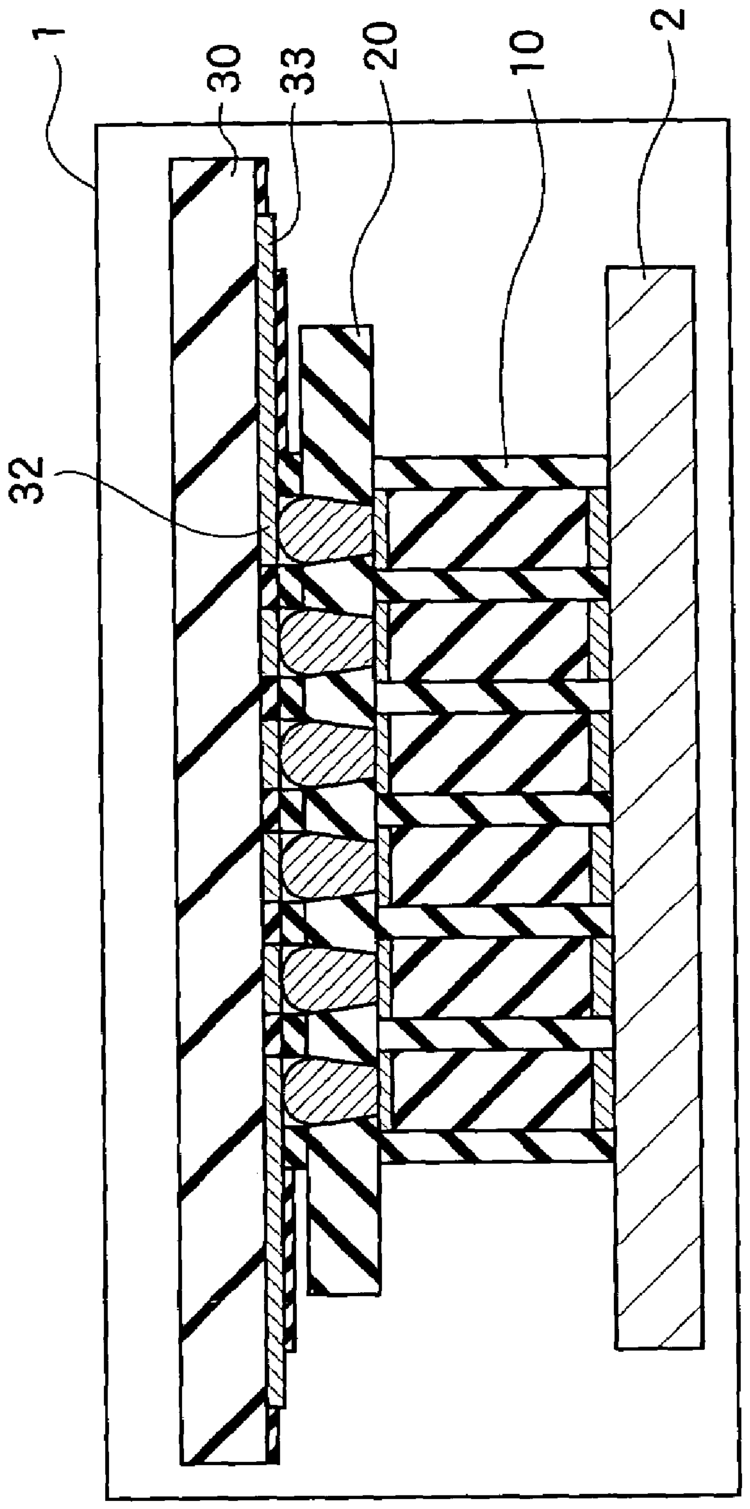
FIG. 13 is a view for explaining a process of joining together the interlayer board and the wiring board in the method of manufacturing an ultrasonic transducer according to the first embodiment of the invention.

FIG. 13 is a view for explaining a process of joining the interlayer board and the wiring board together.

As shown in FIG. 13, the wiring board 30 is stacked such that its surface formed with the electrodes and wiring is directed down, on the interlayer board 20 joined with the vibrator arrangement 10. Herein, a position of the wiring board 30 is adjusted such that the matrix electrodes 32 formed on the wiring board 30 are respectively opposed to the portions of solder 21 filled in the through-holes formed in the interlayer board 20. In the case where a material possessing light transmissivity such as quartz glass or polyimide is used as the wiring board 30, position adjustment can be easily carried out by previously providing alignment marks on the board. On the other hand, even in the case where a material not possessing light transmissivity, position adjustment is possible by previously forming alignment marks or through-holes on the wiring board 30 or interlayer board 20.

Again, the quartz chamber 1 is filled with an inert gas such as argon. By energizing the heater plate 2, temperature of the solder 21 is raised to nearly its melting point. This fuses the other part (the upper in the figure) of the ball form of the solder 21 filled in the through-holes formed in the interlayer board 20, and the other part is joined to the matrix electrodes 32 of the wiring board 30 arranged opposed to the solder 21.

As explained in the above, manufactured is an ultrasonic transducer according to the first embodiment of the invention. Thereafter, wire-bonding is made to connect wiring for providing drive signals for driving the vibrators and receiving detection signals generated by the vibrators to the pad electrodes provided at the peripheral edge of the ultrasonic transducer.

In this embodiment, the interlayer board and the wiring board are joined together after joining the vibrator arrangement and the interlayer board. However, after stacking the vibrator arrangement and the interlayer board together and arranging solder balls, the wiring board may be stacked thereon to simultaneously join them together.

Figure 14:
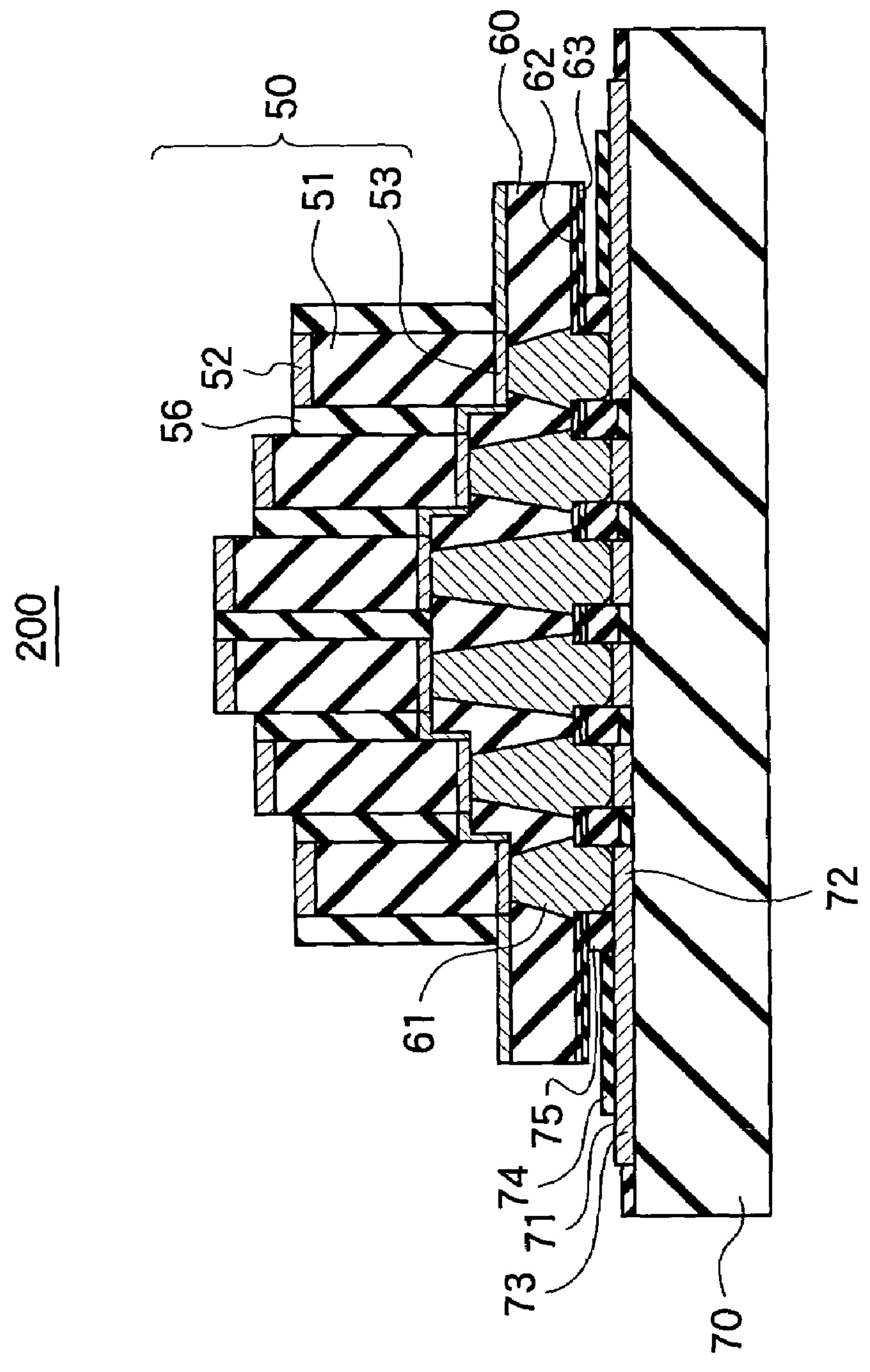
FIG. 14 is a sectional view showing an ultrasonic transducer according to a second embodiment of the invention.

Explanation is now made on an ultrasonic transducer according to a second embodiment of the invention. FIG. 14 is a sectional view showing an ultrasonic transducer of this embodiment.

As shown in FIG. 14, an ultrasonic transducer 200 includes an interlayer board 60 which is structured to have steps. The interlayer board 60 is formed with through-holes filled with solder 61, an insulating layer 62 and a lattice layer 63, similarly to the first embodiment. Furthermore, a wiring board 70 is formed with a wiring layer 71, matrix electrodes 72, pad electrodes 73, an insulating layer 74 and a lattice layer 75, similarly to the first embodiment.

A plurality of vibrators 51, included in a vibrator arrangement 50, are arranged throughout a plurality of steps provided on the interlayer board 60. Each vibrator 51 is formed with electrodes 52, 53. A fixing material 56 is filled between the vibrators 51 to hold the vibrators 51 and absorb the vibrations by an ultrasonic wave.

By thus providing the steps on the vibrator arrangement, interference can be reduced that occurs between near vibrators. The ultrasonic transducer 200 has a plan view similar to FIG. 2.

Figure 15:
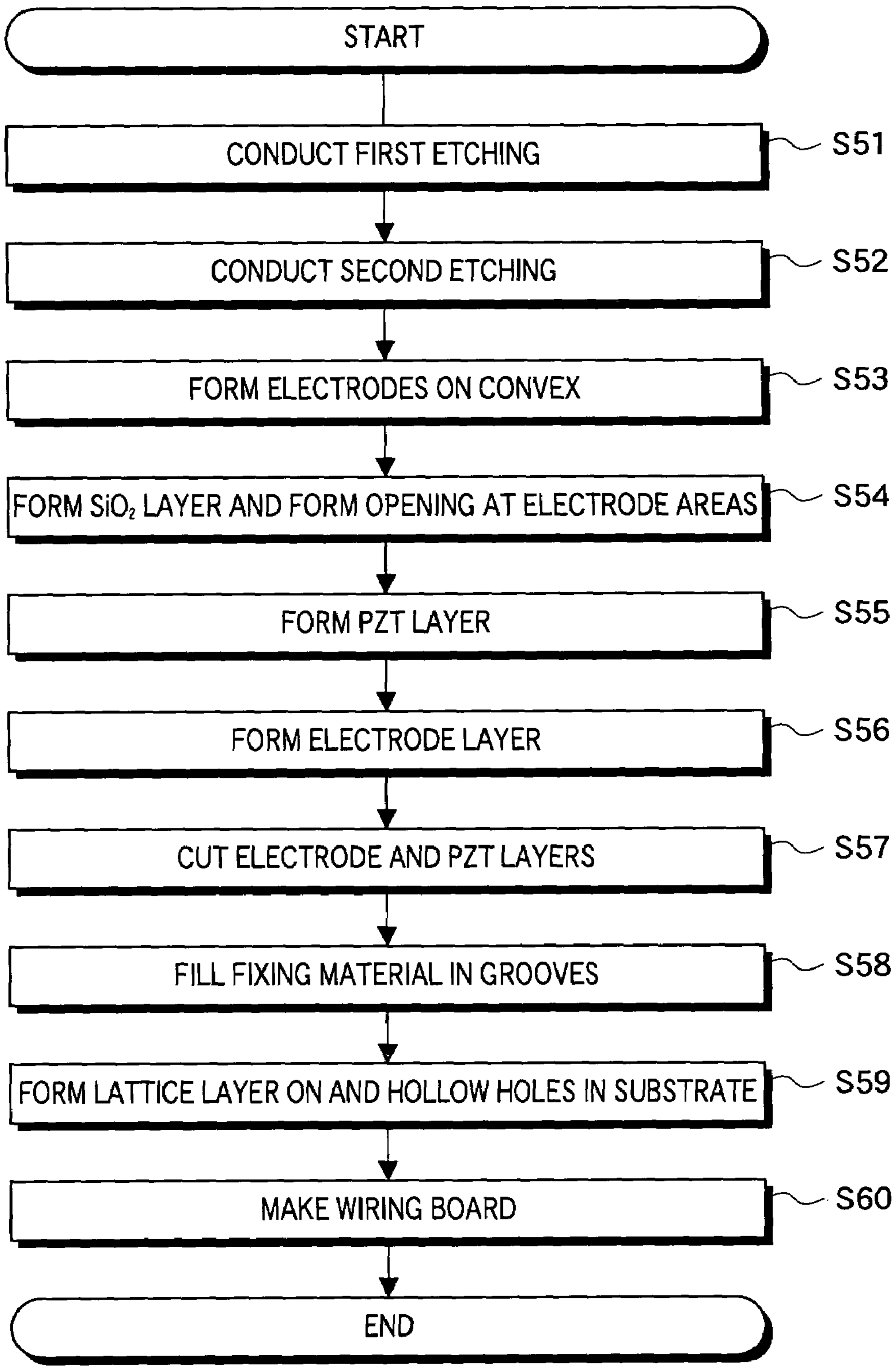
FIG. 15 is a flowchart showing a method of manufacturing an ultrasonic transducer according to a second embodiment of the invention.

Referring to FIGS. 15 to 19B, explanation is made on a method of manufacturing an ultrasonic transducer according to the second embodiment of the invention. FIG. 15 is a flowchart showing a manufacturing method of an ultrasonic transducer according to this embodiment. Meanwhile, FIGS. 16A-16D are views for explaining a fabrication process of n interlayer board having steps.

Figure 16A:
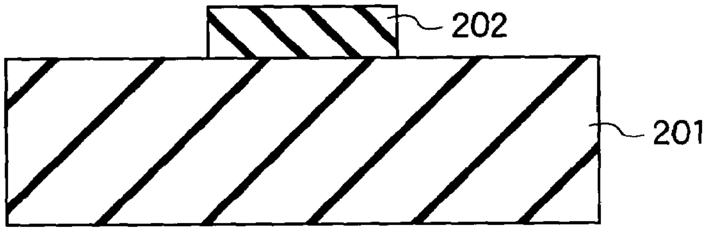
FIGS. 16A-16D are views for explaining a fabrication process of an interlayer board having steps in the method of manufacturing an ultrasonic transducer according to the second embodiment of the invention.
Figure 16B:
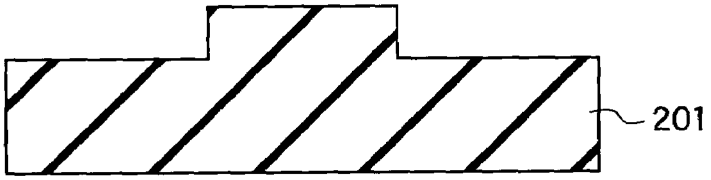

At step S51 of FIG. 15, a resist material 202 is applied to a non-doped Si substrate 201 to carry out a first round of etching by the use of a potassium hydroxide solution at 80° C. or the like, as shown in FIG. 16A. By removing the resist material 202 by using acetone or the like, the steps are formed as shown in FIG. 16B.

Figure 16C:
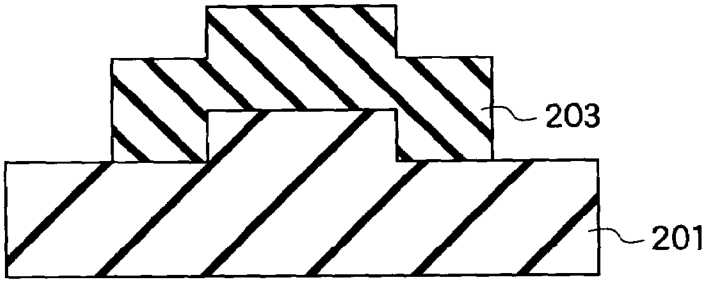
Figure 16D:
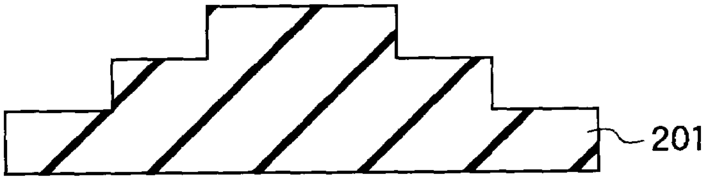

Next, at step S52, a resist material 203 is applied to the substrate 201 formed with one step to carry out a second round of etching by using a potassium hydroxide solution at 80° C. or the like, as shown in FIG. 16C. By removing the resist material 203 by using acetone or the like, fabricated is a non-doped Si substrate formed with a plurality of steps, as shown in FIG. 16D.

By carrying out the second round of etching, an interlayer board is formed that has a convex form in three steps. In the case of increasing a number of steps, etching may be repeated furthermore.

Figure 17A:
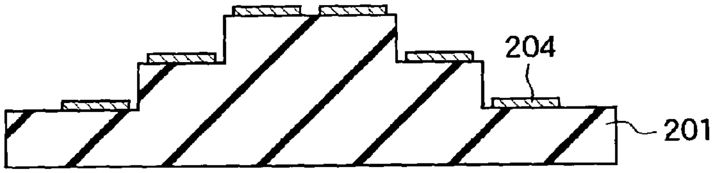
FIGS. 17A-17E are views for explaining a fabrication process of a vibrator arrangement having steps in the method of manufacturing an ultrasonic transducer according to the second embodiment of the invention.

A vibrator arrangement is formed on the interlayer board having the steps fabricated in this manner. FIGS. 17A-17E are views for explaining a fabrication process of a vibrator arrangement having the steps. At step S53, electrodes 204 to be used for applying voltages to vibrators are formed on the convex region of the substrate 201, as shown in FIG. 17A. For example, a resist layer, which is opened in the areas where electrodes are to be formed, is formed by a photolithography process or the like. Then, a Ti layer having a thickness of 500 angstrom, a Pt layer having a thickness of 500 angstrom and an Au layer having a thickness of 5000 angstroms are stacked in this order by a vacuum deposition process. By removing the resist layer by lift-off technique, a three-layer electrode is formed.

Figure 17B:
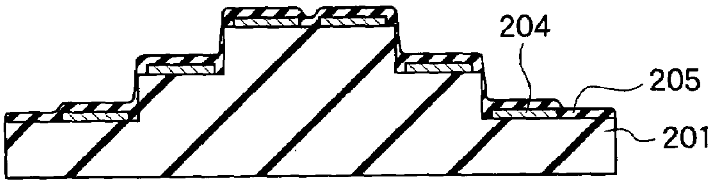
Figure 17C:
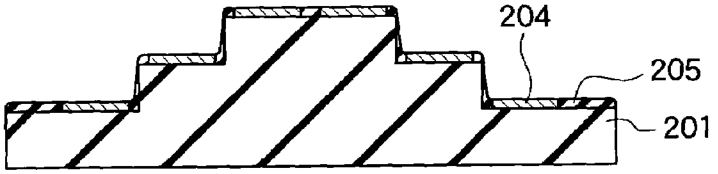

Next, at step S54, an SiO2 layer 205 is formed on the substrate 201 by a plasma CVD process or the like, as shown in FIG. 17B. Thereafter, as shown in FIG. 17C, a photolithographic etching process is carried out to remove the $SiO_2$ layer 205 at the areas of the electrodes 204 formed at step S53.

Figure 17D:
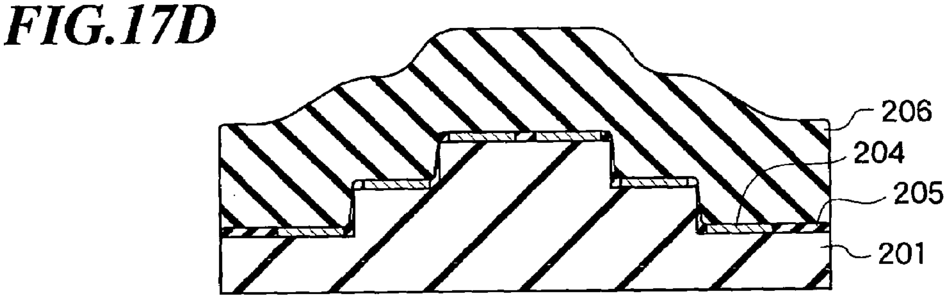
Figure 17E:
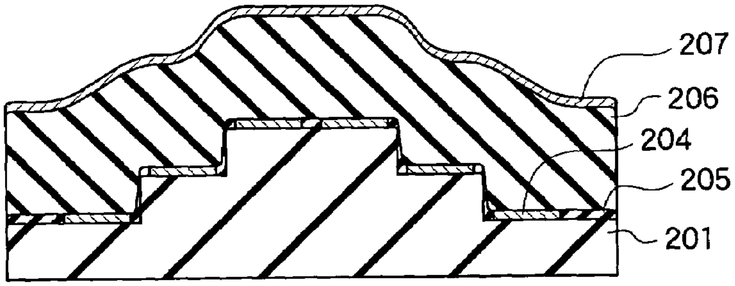

At step S55, a PZT layer 206 is formed by a sputter process or the like on the substrate 201, as shown in FIG. 17D. Furthermore, at step S56, a Ti/Pt/Au three-layered electrode layer 207 is formed on the PZT layer 206 by a vacuum deposition process or the like, as shown in FIG. 17E.

Figure 18A:
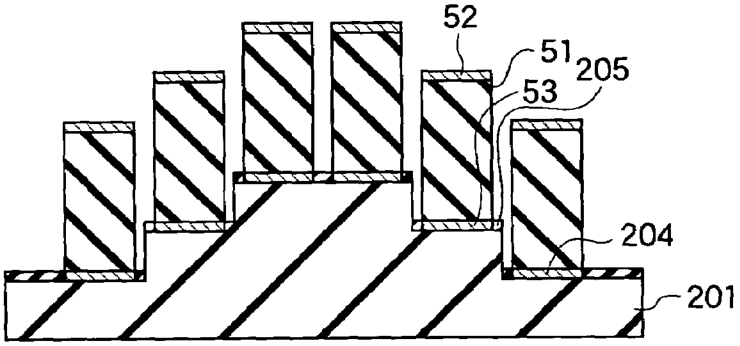
FIGS. 18A-18C are views for explaining a fabrication process of an interlayer board formed with a vibrator arrangement in the method of manufacturing an ultrasonic transducer according to the second embodiment of the invention.
Figure 18B:
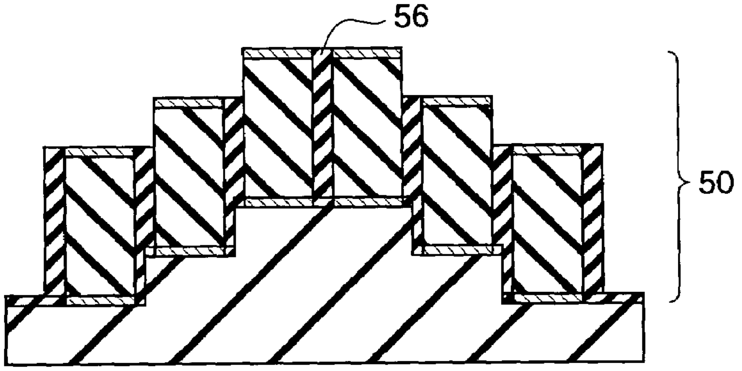

At step S57, the electrode layer 207 and PZT layer 206 is cut by a dicer having a pitch of, for example, 0.3 mm. Herein, cutting is carried out until reaching the height of the electrode 204. In this manner, vibrators 51 and electrodes 52, 53 are fabricated as shown in FIG. 18A. Furthermore, at step S58, a fixing material 56 of acrylic or epoxy adhesive is filled in the grooves cut by the dicer and fixed. This forms a vibrator arrangement 50 having steps as shown in FIG. 18B.

Figure 18C:
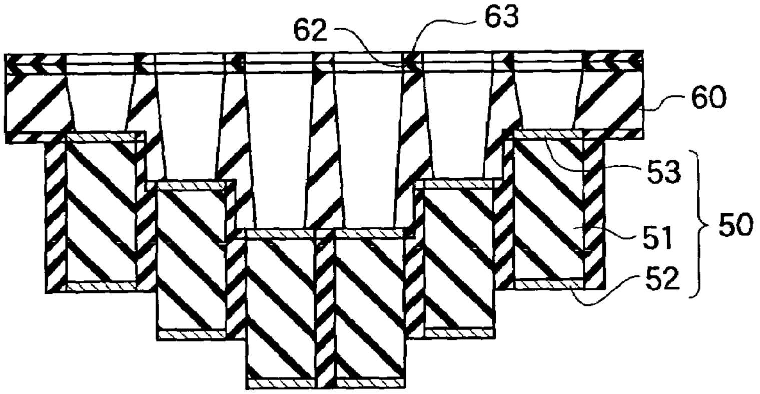

Next, at step S59, an $SiO_2$ layer, a lattice layer and tapered through-holes are formed on a substrate surface where the vibrator arrangement is not formed (the upper in the figure) as shown in FIG. 18C. These processes are similar to the processes explained in the first embodiment while referring to FIG. 6. Herein, in this embodiment, the through-holes to be filled with solder are formed extending to the electrodes 53. In this manner, an interlayer board 60 is fabricated that is formed with the vibrator arrangement 50.

Furthermore, at step S60, a wiring board 70 is fabricated. The fabrication process of the wiring board 70 is similar to that of the first embodiment.

Figure 19A:
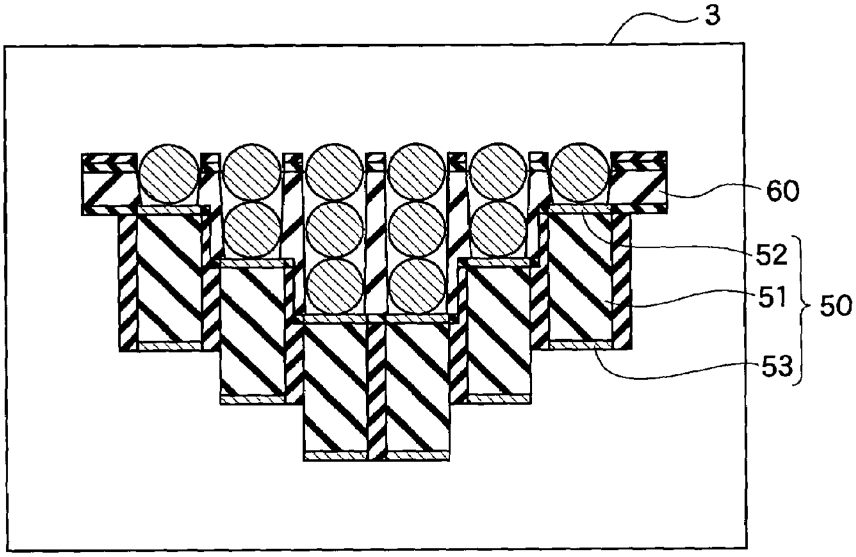
FIGS. 19A and 19B are views for explaining a process of joining together the interlayer board and the wiring board in the method of manufacturing an ultrasonic transducer according to the second embodiment of the invention.
Figure 19B:
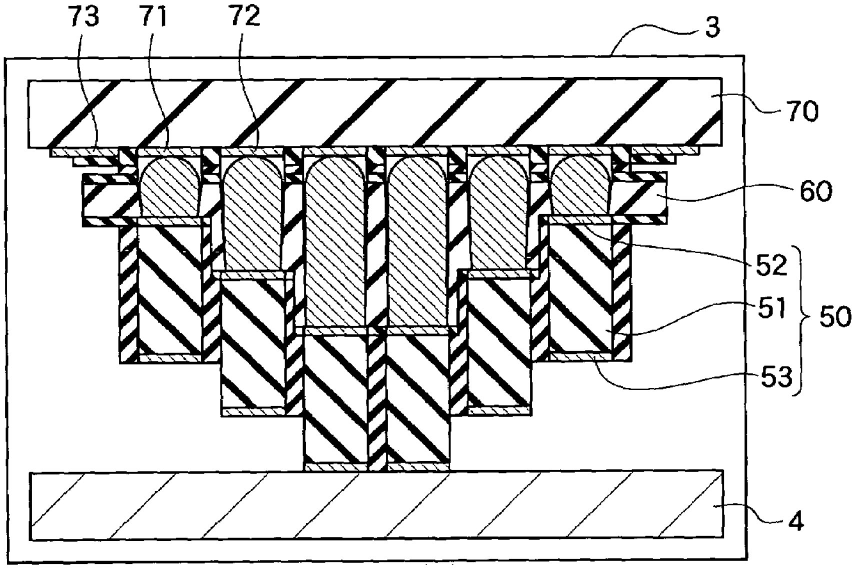

Referring to FIGS. 19A and 19B, explanation is made on a process of joining together the vibrator arrangement and interlayer board thus fabricated.

As shown in FIG. 19A, the vibrator arrangement 50 and the interlayer board 60 are held in a quartz chamber 3 such that the interlayer board 60 is positioned in the upper. Furthermore, a proper number of solder balls (ball-formed solder) 61 are respectively put in a plurality of through-holes formed in the interlayer board 60. The solder ball 61 is made of a low melting solder containing a material of, for example, lead-tin-silver alloy (Pb—Sn—Ag), which has a diameter smaller than the greater diameter of the through-hole (the upper in the figure). Herein, as the solder 61 a resin-contained solder or conductive paste may be used which contains a resin material, a conductive electrode layer formed on an outer periphery of the resin material, and a solder layer, similarly to that in the first embodiment.

Next, the quartz chamber 3 is filled with an inert gas such as argon, to radiate laser light to the solder arranged in the through-holes. Due to this, a part (the lower in the figure) of the solder 61 is heated up to nearly its melting point (e.g. 120°) and perfectly joined to the electrodes 53 in a manner being filled in the through-holes. At this time, an upper part of the solder 61 is projected from the interlayer board 60 while remaining a part of the ball form. Thereafter, laser light radiation is ceased to cool down the vibrator arrangement 50 and interlayer board 60 within the quartz chamber.

Next, as shown in FIG. 19B, the interlayer board 60 perfectly joined with the vibrator arrangement is rested on a heater plate 4 set up within the quartz chamber 3. Furthermore, the wiring board 70 is stacked thereto such that its surface formed with electrodes and wiring is directed down. Herein, a position of the wiring board 70 is adjusted in position such that the matrix electrodes 72 formed on the wiring board 70 are opposed to the respective portions of solder 61 filled in the through-holes formed in the interlayer board 60.

Again, the quartz chamber 3 is filled with an inert gas such as argon. By energizing the heater plate 4, temperature of the solder 61 is raised to nearly its melting point. Due to this, the solder 61 is fused and joined with the matrix electrodes 72 on the wiring board 70 arranged opposed to the solder 61.

In this embodiment, steps were provided on the vibrator arrangement to provide the ultrasonic transducer with a convex form. However, steps may be provided in, for example, a concave form such that the vibrator centrally positioned is lower. Namely, the present embodiment can be applied to manufacture an ultrasonic transducer in which a vibrator arrangement has a plurality of steps.

Further, laser light is used in heating up solder to join the vibrator arrangement and the interlayer board together, and therefore, fusion of the solder can be controlled with accuracy and reproducibility.

In the first and second embodiments explained above, in the case where wiring is impossible on the wiring board because of an increased number of vibrators, a multi-level wiring may be provided throughout a plurality of wiring layers while providing one or more interlayer insulating film on a wiring board.

Also, in the first and second embodiments, the vibrators included in the vibrator arrangement are in a two-dimensional matrix form. However, how to arrange them is not limited to that, i.e. a plurality of vibrators may be arranged in a coaxial form.

Furthermore, in the case of using a resin-contained solder in connecting the electrodes formed on the vibrators to the matrix electrodes formed on the wiring board, the ultrasonic vibrations caused or received by the vibrators are absorbed by the resin material contained in the resin-contained solder. Thus, the acoustic reflection upon the vibrators is reduced to further improve the sensitivity of the ultrasonic transducer and enhance the resolving power thereof.

As described above, according to the present invention, the provision of an interlayer board makes it possible to easily join electrodes to a multiplicity of micro-fabricated vibrators and provide the electric wiring. Also, the provision of an interlayer board prevents solder from flowing out and provides positive joining at the junction between the vibrator and the electrodes, thus improving manufacture yield. Particularly, according to the method of forming tapered through-holes in an interlayer board and joining a substrate or the like thereto after putting solder balls in the through-holes, there is no fear that the solder ball fall out of the interlayer board, thereby enabling operation with efficiency and positiveness. Accordingly, it is possible to realize a two-dimensional transducer densely integrated with a multiplicity of vibrators. The use of an ultrasonic-application probe including such a two-dimensional transducer makes possible to obtain an ultrasonic image with quality.

Figure 20:
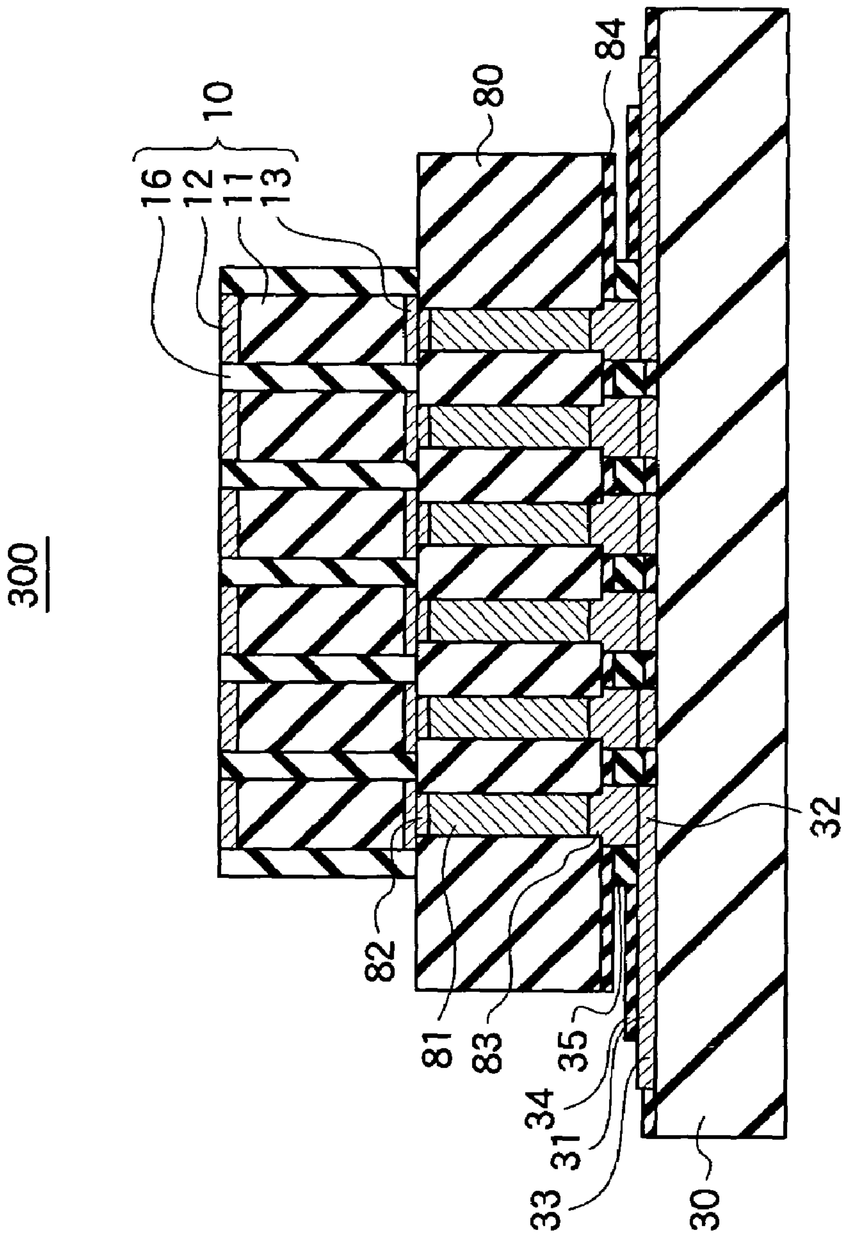
FIG. 20 is a sectional view showing the ultrasonic transducer according to a third embodiment of the invention.

Next, an ultrasonic transducer according to a third embodiment of the present invention will be explained. FIG. 20 is a sectional view showing the ultrasonic transducer according to the embodiment.

As shown in FIG. 20, an ultrasonic transducer 300 according to the embodiment has an interlayer board 80 in place of the interlayer board 20 as shown in FIG. 1. The constructions of the vibrator arrangement 10 and the interlayer board 20 joined together via the interlayer board 80 are the same as shown in FIG. 1.

In the embodiment, the interlayer board 80 is formed by a material that can absorb ultrasonic wave easily such as polyimide resin, urethane resin or silicon (Si) rubber, and functions as a backing material for attenuating unwanted ultrasonic wave by absorbing the vibration generated in the vibrator arrangement 10.

Further, in the interlayer board 80, plural through-holes are formed in correspondence with the arrangement of plural electrodes 13 provided on the vibrator arrangement 10 side and plural electrodes 32 provided on the wiring board 30 side. In each of these through-holes, a conductive material 81 such as conducting wire or conductive paste is disposed. The conductive material 81 is joined to the electrode 13 via solder 82, and joined to the matrix electrode 32 via solder 83. Thereby, the plural electrodes 13 on the vibrator arrangement 10 side are electrically connected to the plural electrodes 32, on the wiring board 30 side, respectively. Furthermore, in order to block the flowing out of the solder between the adjacent through-holes, a lattice layer 84 may be provided in the interlayer board 80.

Figure 21A:
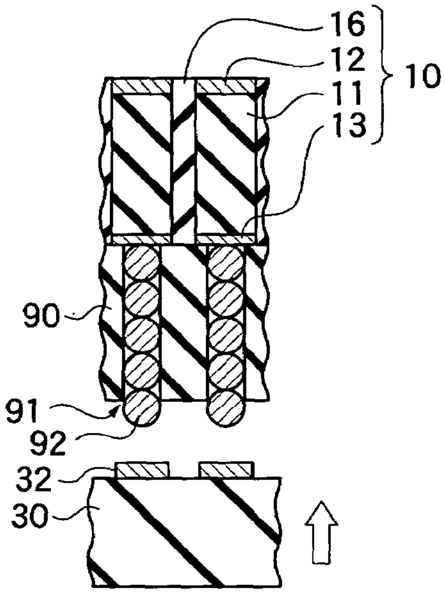
FIGS. 21A and 21B are views for explaining the case where the vibrator arrangement and the wiring board are joined together by arranging plural solder balls in the through-holes formed in the backing material.
Figure 21B:
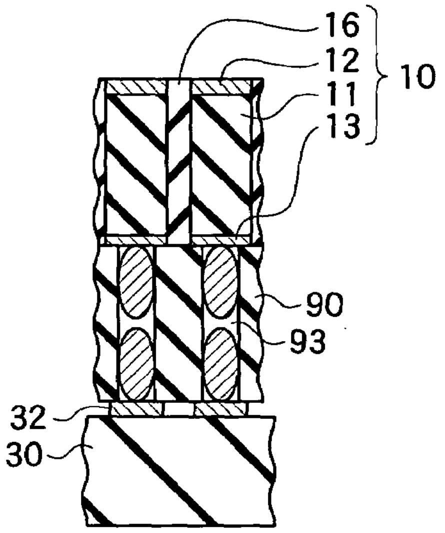
Figure 22:
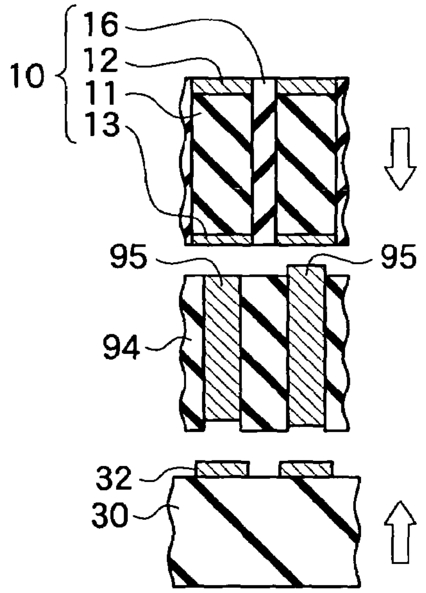
FIG.22 PRIOR ART
FIG. 22 is a view showing a conventional example in which the vibrator arrangement and the wiring board are joined together via the backing material with conducting wires embedded.

Here, the reason for connecting the electrodes to each others by using the conductive materials 81 and solder 82 and 83 in the embodiment will be explained by referring to FIGS. 21A to 22. In FIGS. 21A to 22, for simplicity of explanation, the upper part of the wiring board 30 is shown by simplification.

In the case of using an interlayer board 90 as a backing material, the interlayer board 90 is required to be made thicker to some degree in order to attenuate ultrasonic wave sufficiently. In such a case, it is conceivable that the electrode 13 on the vibrator arrangement 10 side is connected to the electrode 32 on the wiring board 30 side by arranging solder balls 91 in number according to the length of the through-hole 90 within the through-hole 91 as shown in FIG. 21A. Further, in the interlayer board having steps as shown in FIG. 19A, plural solder balls may be arranged in one through-hole according to the length of the through-hole. However, in the case where the diameter and shape of the solder ball and the size (diameter and length) of the through-hole are not selected to have a suitable relationship with each other, there is a possibility that a void 93 is generated within the through-hole when the solder balls are molten and disconnection occurs. Thereby, the vibrator 11 can not be vibrated and the reliability of the ultrasonic transducer becomes deteriorated.

On the other hand, as shown in FIG. 22, the method of connecting the electrode 13 on the vibrator arrangement 10 side to the electrode 32 on the wiring board 30 side via a conducting wire 95 embedded in a backing material 94 is known. However, defective wiring easily occurs because dispersion in lengths of the conducting wires 95 is unavoidable as shown in FIG. 22, and it is difficult to accurately align the lengths of the conducting wires 95 with the height of the backing material 94.

Accordingly, in the embodiment, by arranging the conductive materials 81 within the through-holes of the interlayer board 80 in advance and arranging the solder 82 and 83 on the ends of the conducting wires when joining the respective parts, the conductive materials 81 are connected to both electrodes 13 and 32. Thereby, there is no longer any possibility of disconnection within the through-holes, and the ends of the conductive materials 81 and the electrodes 13 and 32 can be joined together reliably.

Next, a method of manufacturing the ultrasonic transducer according to the embodiment will be described.

Figure 23A:
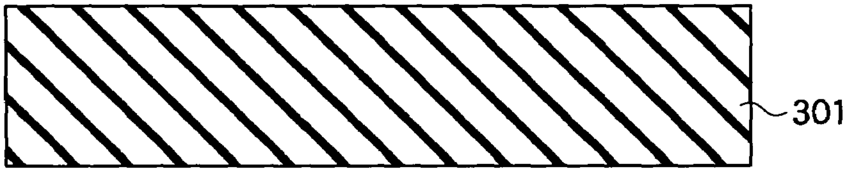
FIGS. 23A-23C are views for explaining the step of fabricating an interlayer board in the method of manufacturing an ultrasonic transducer according to the third embodiment of the invention.
Figure 23B:
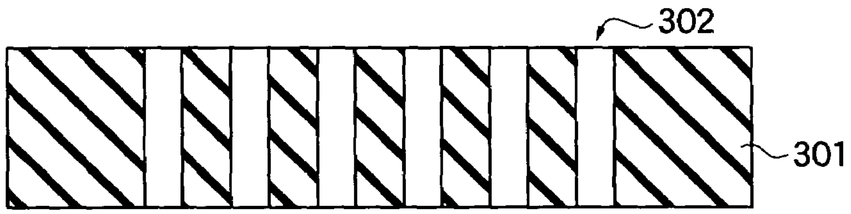
Figure 23C:
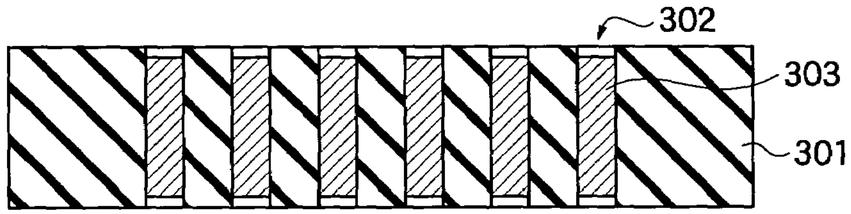
Figure 24:
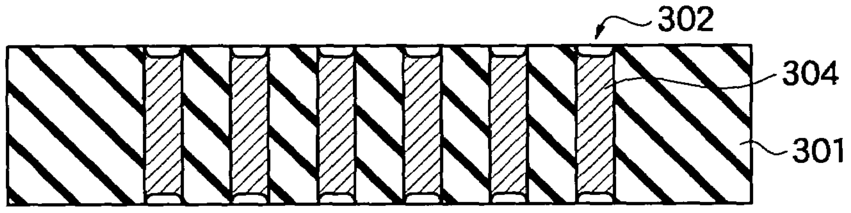
FIG. 24 is a sectional view showing the state in which the through-holes of the interlayer board are filled with a conductive paste.

FIGS. 23A to 24 are views for explaining the process of fabricating the interlayer board 80 (see FIG. 20) to be used in the ultrasonic transducer according to the embodiment.

First, as shown in FIG. 23A, a resin material 301 having a backing function such as polyimide resin, epoxy resin, urethane resin or silicon (Si) rubber is prepared, and, as shown in FIG. 23B, plural through-holes 302 are formed in a predetermined arrangement by using a laser drill or the like. Then, into the plural through-holes 302, conducting wires 303 formed in predetermined lengths are inserted. As a material of the conducting wire, a metal such as copper (Cu), nickel (Ni), iron (Fe), gold (Au), silver (Ag) or platinum (Pt), or an alloy containing one of these metals can be used. Alternatively, instead of inserting the conducting wires 303, the plural through-holes 302 may be filled with a conductive paste 304 such as a silver (Ag) paste as shown in FIG. 24. Thereby, the interlayer board 80 (FIG. 20) in which the conductive materials 81 are arranged is fabricated.

Here, the length of the conducting wire 303 arranged in the through-hole 302 or the arrangement region of the conductive paste 304 is desirably made equal to or more than 50% and less than 100% of the length of the through-hole 302, and preferably, equal to or more than 80% and less than 100% thereof. This is because, in the case where the arrangement region of the conducting wire 303 or the conductive paste 304 is too short, there is a possibility that voids are generated between the conducting materials and solder. On the contrary, in the case where the arrangement region is too long, gaps are generated between the vibrator arrangement 10 and the interlayer board 80, and thus, the ultrasonic wave generated in the vibrator arrangement 10 is difficult to propagate to the interlayer board 80. Further, since recesses are produced between the upper surface of the interlayer board 80 and ends of the conducting wires 303 by making the arrangement regions of the conducting wires 303 less than 100% of the through-holes 302, the recesses can be utilized when solder balls are arranged in the subsequent step.

In the case where the lattice layer 84 is further provided on the interlayer board 80 as shown in FIG. 20, before the through-holes 302 are formed in FIG. 23B, for example, a negative photosensitive polyimide is applied thereto and developed after ultraviolet light is applied to the area in which the lattice layer 84 (see FIG. 20) is formed. Alternatively, in FIG. 23C, the lattice layer 84 may be formed before or after the conducting wires 303 or conductive paste 304 (i.e., conductive materials 81) are arranged in the through-holes 302.

FIGS. 25A to 25D are views for explaining the process of joining the vibrator arrangement 10, the interlayer board 80, and the wiring board 30 together. The manufacturing processes of the vibrator arrangement 10 and the wiring board 30 are the same as described in the first embodiment of the present invention.

Figure 25A:
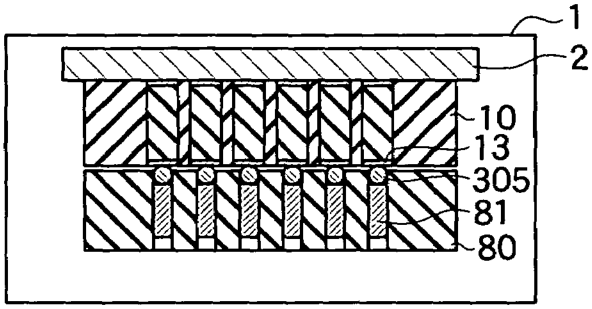
FIGS. 25A and 25B are views for explaining the step of joining together the interlayer board and the wiring board in the method of manufacturing an ultrasonic transducer according to the third embodiment of the invention.
Figure 25B:
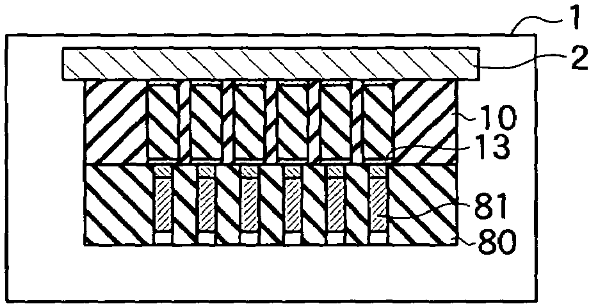

First, as shown in FIG. 25A, the interlayer board 80 is placed within the quartz chamber 1, and solder balls 305 are located in recesses on one ends of the respective through-holes 302. The vibrator arrangement 10 is mounted thereon so that the plural electrodes 13 on the vibrator arrangement 10 side and the plural through-holes 301 on the interlayer board 80 side may be opposed, respectively. Furthermore, the heater plate 2 is placed on the vibrator arrangement 10, and the space within the quartz chamber 1 is filled with an inert gas such as argon and the heater plate 2 is energized for heating. Thereby, the solder balls 305 arranged in the respective through-holes 302 are molten and the conductive materials 81 and the electrodes 13 are joined together as shown in FIG. 25B.

Figure 25C:
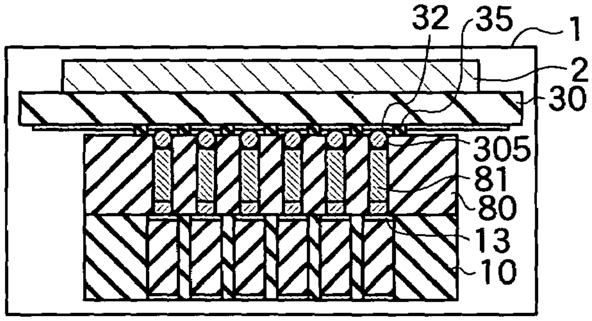
Figure 25D:
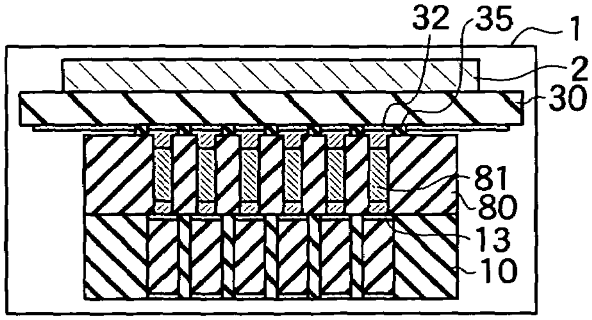

Next, the interlayer board 80 joined to the vibrator arrangement 10 is turned over and solder balls 305 are arranged in the recesses on the other ends of the respective through-holes 301. Then, as shown in FIG. 25C, the vibrator arrangement 10 is mounted thereon so that the plural electrodes 32 on the wiring board 30 side and the plural through-holes on the interlayer board 80 side may be opposed, respectively. The heater plate 2 is placed thereon to melt the solder balls 305, and thereby, the conductive materials 82 and the electrodes 32 are joined together. Thus, as shown in FIG. 25D, the plural electrodes 13 on the arrangement 10 side and the plural electrodes 32 on the wiring board 30 side are electrically connected, respectively.

The material of the solder balls, the alignment method when the vibrator arrangement 10 is superposed, etc. are the same as described in the first embodiment of the present invention.

As described above, according to the embodiment, since the conductive materials such as conducting wires or conductive paste have been arranged in the plural through-holes formed in the interlayer board in advance, voids are no longer produced within the through-holes. Further, by using solder, the conductive materials and electrodes can be joined together reliably even when the lengths of the conducting materials vary. Therefore, the reliability of the manufactured ultrasonic transducer can be improved.

Next, another method of fabricating the interlayer board to be used in the ultrasonic transducer according to the embodiment will be described by referring to FIGS. 26A to 26D.

Figure 26A:
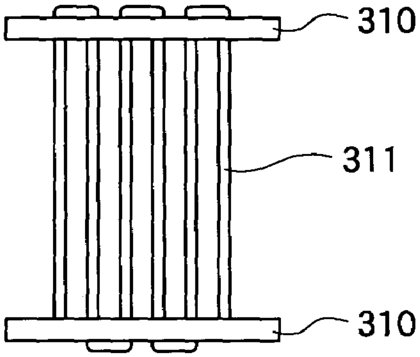
FIGS. 26A to 26D are views for explaining another method of fabricating the interlayer board in which conductive materials are arranged.
Figure 26B:
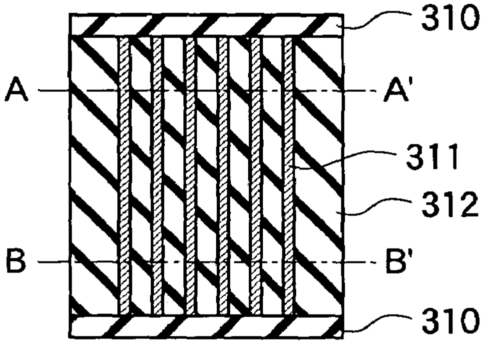
Figure 26C:
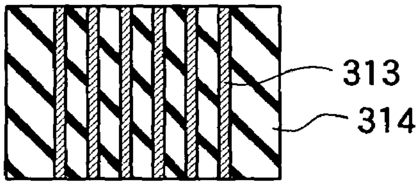
Figure 26D:
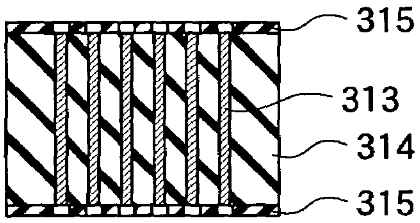

First, as shown in FIG. 26A, conducting wires 311 are strung between two fixing plates 310, which are disposed so as to be opposed, according to the arrangement pitch of the conductive materials 81 in the interlayer board 80 as shown in FIG. 20. Then, the two fixing plates 310 with the conducting wires 311 strung therebetween are put in a container, and a liquid resin material is poured therein and cured. This resin material is a sound absorbing material such as polyimide resin or epoxy resin, and subsequently used as a backing material. Thereby, as shown in FIG. 26B, gaps around the conducting wires 311 are filled with a resin material 312. By cutting this at A-A' surface and B-B' surface, a resin board 314 on which conducting wires 313 are arranged is fabricated as shown in FIG. 26C. Furthermore, a negative photosensitive polyimide is applied onto both sides of the resin board 314, and the negative photosensitive polyimide is developed after ultraviolet light is applied to areas other than the conducting wires 313. Thereby, as shown in FIG. 26D, resin layers 315 are formed in the areas except for the conducting wires 313 on both sides of the resin board 314. By the resin layers 315, recesses in which solder balls 305 (see FIGS. 25A and 25C) are to be arranged when the interlayer board 810 and the vibrator arrangement 10 or the like are joined together are formed on end surfaces of the conducting wires 313.

In the embodiment, solder balls are used when the conductive materials arranged in the through-holes and the electrodes are joined together, however, resin-contained solder balls as shown in FIG. 12A to 12D may be used. In this case, even when the lengths of the conducting materials vary within the through-holes, because the variations can be absorbed by the elasticity of the resins within the solder balls, the conductive materials and the electrodes can be joined more reliably. Further, due to the elasticity thereof, the effect of absorbing unwanted ultrasonic wave is expected, and thereby, it is possible to make higher the function of the interlayer board as a backing material. Alternatively, a conductive paste may be used in place of the solder when the conductive materials arranged in the through-holes and the electrodes are jointed together.

Figure 27:
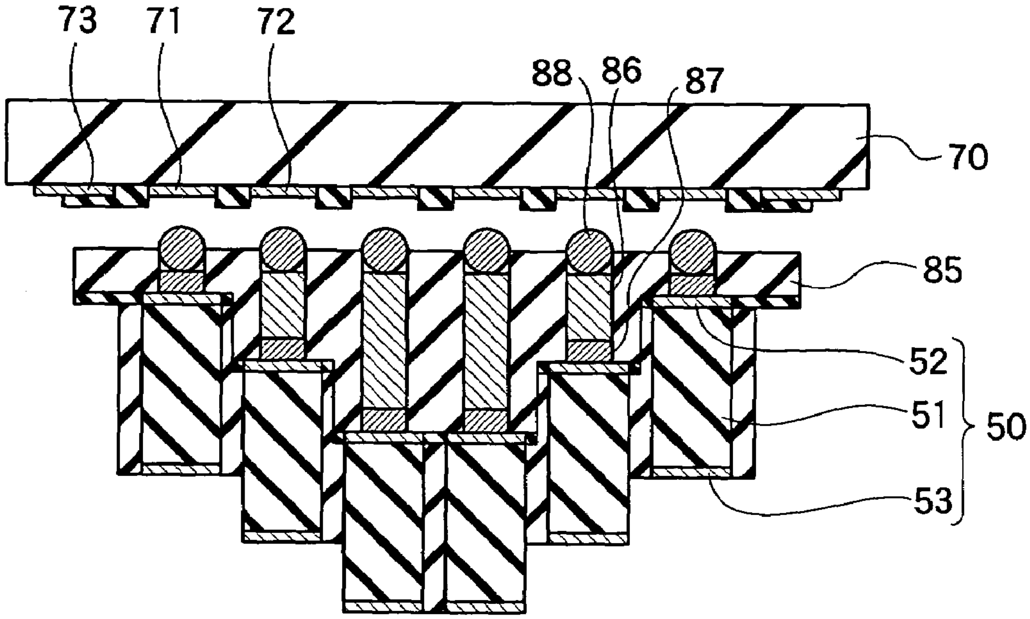
FIG. 27 is a sectional view showing an example in which the method of joining the vibrator arrangement and the wiring board in the ultrasonic transducer according to the third embodiment of the invention is applied to the ultrasonic transducer as shown in FIG. 14.

The above-mentioned third embodiment of the present invention can be applied to the interlayer board having steps, which has been explained in the second embodiment of the present invention. FIG. 27 is a view for explaining such an application example, and shows the states of the step of joining an interlayer board 85, which has been joined to a vibrator arrangement 50, to a wiring board 70. The constructions of the vibrator arrangement 50 and the wiring board 70 are the same as shown in FIG. 14.

Plural conductive materials 86 including conducting wires or conducting paste are arranged in plural through-holes formed in the interlayer board 85, respectively. One ends of the plural conductive materials 86 are connected by solder 87 to plural electrodes 52 on the vibrator arrangement 50 side, respectively. Further, in other end surface areas of the plural conducting materials 86, solder balls 88 are arranged. By melting the solder balls 88, the plural conducting materials 86 are connected to electrodes 72 of the wiring board 70 side, respectively. The materials to be used as the interlayer board 85, the conductive materials 86, the solder 87, and the solder balls 88 are the same as in the third embodiment of the present invention. Further, the percentage of the length of the conductive material 86 against the length of each through-hole is desirably made equal to or more than 50% and less than 100%, and preferably, equal to or more than 80% and less than 100%. Similarly, in this application example, a lattice layer may be formed on the interlayer board and resin-containing solder or conductive paste may be used in place of solder balls. In the case where the lengths of the through-holes are short like the case of the through-holes formed on the right end and left end of the interlayer board 85 and there is no fear that voids are produced, conductive materials are not necessarily arranged and joining may be performed by using solder balls only.

The invention claimed is:

1. An ultrasonic transducer comprising:

a vibrator arrangement having a plurality of vibrators provided in a predetermined arrangement in which gaps between the plurality of vibrators are filled with a fixing material for absorbing vibrations of the plurality of vibrators, each of the plurality of vibrators having a first electrode and a second electrode;

a first board having a flat region for holding at least the fixing material of the vibrator arrangement, said first board being formed with a plurality of through-holes in positions corresponding to the second electrodes of the plurality of vibrators; and a second board having a plurality of electrodes electrically connected to the second electrodes of the plurality of vibrators through the plurality of through-holes formed in the first board, respectively.

2. An ultrasonic transducer according to claim 1, wherein the plurality of vibrators are arranged in a two-dimensional matrix form.

3. An ultrasonic transducer according to claim 1, wherein the plurality of vibrators are arranged on a same plane.

4. An ultrasonic transducer according to claim 1, wherein the first board includes one of a silicon substrate and a polyimide substrate.

5. An ultrasonic transducer according to claim 1, wherein each of the plurality of through-holes formed in the first board has a taper form in which a diameter at a side of said second board is larger than a diameter at a side of said vibrator arrangement.

6. An ultrasonic transducer according to claim 1, wherein the first board includes an insulating layer formed around the plurality of through-holes.

7. An ultrasonic transducer according to claim 6, wherein the insulating layer includes at least one of an insulating resin film including polyimide resin and a dielectric insulating film including one of silicon oxide ($SiO_2$), silicon nitride (SiN) and alumina ($Al_2O_3$).

8. An ultrasonic transducer according to claim 1, wherein the second board has an insulating layer formed around a region where the plurality of electrodes are formed.

9. An ultrasonic transducer according to claim 8, wherein the insulating layer includes at least one of an insulating resin film including polyimide resin and a dielectric insulating film including one of silicon oxide ($SiO_2$), silicon nitride (SiN) and alumina ($Al_2O_3$).

10. An ultrasonic transducer according to claim 1, wherein the second electrodes of the plurality of vibrators and the plurality of electrodes of the second board are electrically connected to each others respectively by using one of solder, resin-contained solder including a resin material with an electrode layer and a solder layer formed on the resin material, and a conductive paste.

11. An ultrasonic transducer according to claim 1, wherein the plurality of electrodes of the second board are electrically connected to the second electrodes of the plurality of vibrators respectively via (i) one of solder, resin-contained solder including a resin material with an electrode layer and a solder layer formed on the resin material, and conductive paste and (ii) conductive materials respectively arranged in the plurality of through-holes formed in the first board and each including one of a conducting wire and conducting paste.

12. An ultrasonic transducer according to claim 11, wherein the first board includes one of polyimide resin, epoxy resin, urethane resin, and silicon rubber.

13. An ultrasonic transducer according to claim 12, wherein the first board serves as a backing material.

14. An ultrasonic transducer according to claim 11, wherein lengths of the conductive materials are not less than 50% and less than 100% of lengths of the plurality of through-holes formed in the first board.

15. An ultrasonic transducer comprising: a vibrator arrangement having a plurality of vibrators provided in a predetermined arrangement, each of the plurality of vibrators having a first electrode and a second electrode; a first board for holding the vibrator arrangement, said first board being formed with a plurality of through-holes in positions corresponding to the second electrodes of the vibrators; and a second board having a plurality of electrodes electrically connected to the second electrodes of the plurality of vibrators through the plurality of through-holes formed in the first board, respectively, wherein: the first board has a plurality of steps, and the plurality of vibrators are arranged on the plurality of steps of the first board.

16. An ultrasonic transducer comprising: a vibrator arrangement having a plurality of vibrators provided in a predetermined arrangement, each of the plurality of vibrators having a first electrode and a second electrode; a first board for holding the vibrator arrangement, said first board being formed with a plurality of through-holes in positions corresponding to the second electrodes of the vibrators; and a second board having a plurality of electrodes electrically connected to the second electrodes of the plurality of vibrators through the plurality of through-holes formed in the first board, respectively, wherein the second board has light transmissivity.

17. An ultrasonic transducer according to claim 16, wherein the second board includes one of a quartz glass substrate and a polyimide substrate.

18. A method of manufacturing an ultrasonic transducer, said method comprising the steps of:

(a) preparing a first board formed with a plurality of through-holes in predetermined positions;

(b) arranging a plurality of vibrators onto a first surface of the first board in a predetermined arrangement in which gaps between the plurality of vibrators are filled with a fixing material for absorbing vibrations of the plurality of vibrators, each of the plurality of vibrators having a first electrode and a second electrode;

(c) arranging a second board having a plurality of electrodes onto a second surface of the first board; and (d) arranging one of solder, resin-contained solder including a resin material with an electrode layer and a solder layer formed on the resin material, and conductive paste in the plurality of through-holes formed in the first board and electrically connecting the second electrodes of the plurality of vibrators to the plurality of electrodes of the second board through the plurality of through-holes formed in the first board respectively by using one of the solder, the resin-contained solder, and the conductive paste.

19. A method of manufacturing an ultrasonic transducer according to claim 18, wherein step (a) includes forming an insulating layer around the plurality of through-holes formed in the first board.

20. A method of manufacturing an ultrasonic transducer according to claim 18, wherein step (a) includes forming a plurality of taper-formed through-holes in the first board by using anisotropic etching.

21. A method of manufacturing an ultrasonic transducer according to claim 18, wherein step (b) includes cutting a vibrator plate at a predetermined pitch so as to fabricate the plurality of vibrators.

22. A method of manufacturing an ultrasonic transducer according to claim 18, wherein step (b) includes arranging the plurality of vibrators on a same plane.

23. A method of manufacturing an ultrasonic transducer according to claim 18, wherein step (c) includes forming an insulating layer around a region where the plurality of electrodes are formed in the second board.

24. A method of manufacturing an ultrasonic transducer according to claim 18, wherein step (d) includes the steps of: stacking the plurality of vibrators, the first board arranged with solder balls in the through-holes, and the second board; and simultaneously joining together the vibrators, the first board and the second board by fusing the solder balls.

25. An ultrasonic transducer according to claim 18, wherein step (d) includes the steps of: stacking the plurality of vibrators on a first surface of the first board arranged with solder balls in the through-holes; fusing the solder balls while remaining a part of a ball form of the solder balls thereby filling solder in the plurality of through-holes and joining the vibrators to the first board; stacking the second board on a second surface of the first board; and fusing the part of the ball form of the solder balls thereby joining the second board to the first board.

26. An ultrasonic transducer according to claim 18, wherein step (d) includes fusing one of the solder and the solder layer included in the resin-contained solder by using laser light.

27. A method of manufacturing an ultrasonic transducer according to claim 18, wherein: step (a) includes arranging a conductive material including one of a conducting wire and conducting paste in each of the plurality of through-holes formed in predetermined positions of the first board, and step (d) includes arranging one of solder, resin-contained solder including a resin material with an electrode layer and a solder layer formed on the resin material, and conductive paste in end regions of the conductive material in each of the plurality of through-holes formed in the first board.

28. A method of manufacturing an ultrasonic transducer, said method comprising the steps of: (a) preparing a first board formed with a plurality of through-holes in predetermined positions; (b) arranging a plurality of vibrators, each having a first electrode and a second electrode, onto a first surface of the first board; (c) arranging a second board having a plurality of electrodes onto a second surface of the first board; and (d) arranging one of solder, resin-contained solder including a resin material with an electrode layer and a solder layer formed on the resin material, and conductive paste in the plurality of through-holes formed in the first board and electrically connecting the second electrodes of the plurality of vibrators to the plurality of electrodes of the second board through the plurality of through-holes formed in the first board respectively by using one of the solder, the resin-contained solder, and the conductive paste, wherein: step (a) includes forming a plurality of steps on the first board, and step (b) includes arranging the plurality of vibrators on the plurality of steps of the first board.

* * * * *